US010929016B1

United States Patent
Liu et al.

(10) Patent No.: US 10,929,016 B1
(45) Date of Patent: Feb. 23, 2021

(54) TOUCH CALIBRATION AT KEYBOARD LOCATION

(71) Applicant: Dell Products L.P., Round Rock, TX (US)

(72) Inventors: Yung Chun Liu, Taipei (TW); Jace W. Files, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/774,136

(22) Filed: Jan. 28, 2020

(51) Int. Cl.
*G06F 3/0488* (2013.01)
*G01R 33/07* (2006.01)
*G06F 3/041* (2006.01)
*G06F 1/16* (2006.01)

(52) U.S. Cl.
CPC ....... *G06F 3/04886* (2013.01); *G01R 33/072* (2013.01); *G06F 1/1669* (2013.01); *G06F 3/04186* (2019.05)

(58) Field of Classification Search
CPC ...... G06F 3/041–048; G06F 2203/041–04114; G06F 1/1669; G06F 1/1654; G06F 1/1677; G09G 2320/0693
See application file for complete search history.

(56) References Cited

U.S. PATENT DOCUMENTS

| | | |
|---|---|---|
| 6,606,081 B1 | 8/2003 | Jaeger et al. |
| 6,690,354 B2 | 2/2004 | Sze |
| 6,842,332 B1 | 1/2005 | Rubenson et al. |
| 7,109,893 B2 | 9/2006 | Chen |
| 7,221,330 B2 | 5/2007 | Finke-Anlauff |
| 7,433,179 B2 | 10/2008 | Hisano |
| 7,969,117 B2 | 6/2011 | Lam et al. |
| 7,990,702 B2 | 8/2011 | Tracy et al. |
| 8,321,810 B2 | 11/2012 | Heintze |
| 8,754,855 B2 | 6/2014 | Duncan et al. |
| 9,024,884 B2 | 5/2015 | Lengeling et al. |
| 9,285,837 B2 | 3/2016 | Meierling et al. |
| 9,524,139 B2 | 12/2016 | Aurongzeb et al. |
| 9,964,993 B2 | 5/2018 | North et al. |
| 10,013,228 B2 | 7/2018 | Aurongzeb et al. |
| 10,101,829 B2 * | 10/2018 | Jagtman ................. G06F 3/041 |
| 10,108,337 B2 | 10/2018 | Ligameri et al. |
| 10,156,871 B2 | 12/2018 | Wang et al. |
| 10,198,044 B2 | 2/2019 | Lyles et al. |
| 10,254,803 B1 | 4/2019 | Quinn et al. |
| 10,254,960 B2 | 4/2019 | Zhao |
| 10,296,052 B1 | 5/2019 | Quinn et al. |

(Continued)

*Primary Examiner* — Sanjiv D. Patel
(74) *Attorney, Agent, or Firm* — Zagorin Cave LLP; Robert W. Holland

(57) ABSTRACT

An information handling system touchscreen display detects touches at a touch detection surface as inputs to the information handling system based in part upon periodical calibrations performed by a touch controller. An embedded controller detects placement of a keyboard on the touchscreen display and in response commands the touch controller to cease the periodic calibrations for at least the portion of the touchscreen display on which the keyboard is placed. For instance, the embedded controller interfaces with a Hall sensor disposed under the touchscreen display that detects a magnet integrated in the keyboard. At removal of the keyboard, the embedded controller commands the touch controller to perform a calibration to update touch detection.

17 Claims, 21 Drawing Sheets

(56) References Cited

U.S. PATENT DOCUMENTS

| | | |
|---|---|---|
| 10,296,053 B1 | 5/2019 | Quinn et al. |
| 10,365,822 B2 | 7/2019 | Ligameri et al. |
| 10,429,901 B2 | 10/2019 | Aurongzeb et al. |
| 10,503,207 B1 | 12/2019 | Knoppert et al. |
| 10,503,215 B1 | 12/2019 | Quinn et al. |
| 10,592,051 B1 | 3/2020 | Yildiz et al. |
| 10,656,714 B2 | 5/2020 | Ligtenberg et al. |
| 10,691,177 B2 | 6/2020 | Quinn et al. |
| 10,712,832 B2 | 7/2020 | Torres et al. |
| 10,725,506 B2 | 7/2020 | Iyer et al. |
| 10,732,676 B2 | 8/2020 | Xu et al. |
| 10,739,826 B1 | 8/2020 | Knoppert et al. |
| 10,747,263 B2 | 8/2020 | Aurongzeb et al. |
| 10,747,264 B1 | 8/2020 | Knoppert et al. |
| 10,747,272 B1 | 8/2020 | Morrison et al. |
| 10,754,390 B2 | 8/2020 | Quinn et al. |
| 10,788,864 B2 | 9/2020 | Aurongzeb et al. |
| 10,802,549 B2 | 10/2020 | Quinn et al. |
| 2004/0108968 A1 | 6/2004 | Finke-Anlauff |
| 2004/0190239 A1 | 9/2004 | Weng et al. |
| 2005/0035950 A1 | 2/2005 | Daniels |
| 2006/0034042 A1 | 2/2006 | Hisano et al. |
| 2007/0103266 A1 | 5/2007 | Wang et al. |
| 2008/0122660 A1 | 5/2008 | Koganei |
| 2008/0144263 A1 | 6/2008 | Loughnanae et al. |
| 2008/0203817 A1 | 8/2008 | Luo et al. |
| 2009/0066674 A1* | 3/2009 | Maharyta ............... G06F 3/0418 345/178 |
| 2009/0244016 A1 | 10/2009 | Casparian et al. |
| 2010/0067833 A1 | 3/2010 | Jin et al. |
| 2010/0103109 A1 | 4/2010 | Sun et al. |
| 2010/0146459 A1* | 6/2010 | Repka ................... G06F 3/0416 715/863 |
| 2010/0281268 A1 | 11/2010 | Barreto et al. |
| 2010/0281410 A1 | 11/2010 | Heintze |
| 2011/0001641 A1 | 1/2011 | Tung |
| 2011/0047459 A1 | 2/2011 | Van Der Westhuizen |
| 2011/0209592 A1 | 9/2011 | Chung |
| 2013/0084796 A1 | 4/2013 | Kerr |
| 2013/0222995 A1 | 8/2013 | Wang et al. |
| 2014/0055363 A1 | 2/2014 | Meierling et al. |
| 2014/0211395 A1 | 7/2014 | Lin |
| 2014/0333542 A1 | 11/2014 | Barreca |
| 2015/0001368 A1 | 1/2015 | Sprenger et al. |
| 2015/0116362 A1 | 4/2015 | Aurongzeb et al. |
| 2015/0212551 A1 | 7/2015 | Parchman et al. |
| 2016/0320810 A1* | 11/2016 | Kim .................... G06F 1/1669 |
| 2017/0052751 A1 | 2/2017 | Aurongzeb et al. |
| 2017/0102746 A1 | 4/2017 | Knepper et al. |
| 2017/0177034 A1 | 6/2017 | North et al. |
| 2017/0205855 A1 | 7/2017 | Szeto |
| 2017/0300166 A1* | 10/2017 | Rosenberg .......... G06F 3/04144 |
| 2017/0315032 A1 | 11/2017 | Basiji et al. |
| 2017/0364234 A1 | 12/2017 | Ligameri et al. |
| 2017/0364258 A1 | 12/2017 | Ligameri et al. |
| 2018/0052497 A1 | 2/2018 | Maatta et al. |
| 2018/0210508 A1 | 7/2018 | Aurongzeb et al. |
| 2018/0210514 A1 | 7/2018 | Wang et al. |
| 2018/0210515 A1 | 7/2018 | Lyles et al. |
| 2018/0217668 A1 | 8/2018 | Ligtenberg et al. |
| 2018/0217669 A1 | 8/2018 | Ligtenberg et al. |
| 2018/0218859 A1 | 8/2018 | Ligtenberg et al. |
| 2019/0056864 A1 | 2/2019 | Thai et al. |
| 2019/0073003 A1 | 3/2019 | Xu et al. |
| 2019/0101578 A1* | 4/2019 | Lawrence ............ G06F 3/0446 |
| 2019/0129558 A1 | 5/2019 | Yildiz et al. |
| 2019/0169896 A1 | 6/2019 | Regimbal et al. |
| 2019/0187792 A1 | 6/2019 | Basehore et al. |
| 2019/0205029 A1 | 7/2019 | Zhu et al. |
| 2019/0243426 A1 | 8/2019 | Morrison et al. |
| 2019/0278323 A1 | 9/2019 | Aurongzeb et al. |
| 2019/0361543 A1 | 11/2019 | Zhang |
| 2019/0361694 A1 | 11/2019 | Gordon et al. |
| 2019/0369674 A1 | 12/2019 | Aurongzeb et al. |
| 2020/0042045 A1 | 2/2020 | Quinn et al. |
| 2020/0042046 A1 | 2/2020 | Quinn et al. |
| 2020/0042047 A1 | 2/2020 | Quinn et al. |
| 2020/0042048 A1 | 2/2020 | Quinn et al. |
| 2020/0064892 A1 | 2/2020 | Iyer et al. |
| 2020/0133339 A1 | 4/2020 | Yildiz et al. |
| 2020/0133426 A1 | 4/2020 | Yildiz et al. |
| 2020/0159289 A1 | 5/2020 | Seibert et al. |
| 2020/0159290 A1 | 5/2020 | Seibert et al. |
| 2020/0159293 A1 | 5/2020 | Seibert et al. |
| 2020/0159336 A1 | 5/2020 | Torres et al. |
| 2020/0166964 A1* | 5/2020 | Tsai .................... G06F 1/1616 |
| 2020/0174523 A1 | 6/2020 | Su et al. |
| 2020/0174653 A1 | 6/2020 | Klein et al. |
| 2020/0174660 A1 | 6/2020 | Klein et al. |
| 2020/0192497 A1 | 6/2020 | Knoppert et al. |
| 2020/0201387 A1 | 6/2020 | Knoppert et al. |
| 2020/0233451 A1 | 7/2020 | Hong et al. |
| 2020/0233536 A1 | 7/2020 | Hong et al. |
| 2020/0233537 A1 | 7/2020 | Hong et al. |
| 2020/0233538 A1 | 7/2020 | Aurongzeb et al. |
| 2020/0278747 A1 | 9/2020 | Ligtenberg et al. |
| 2020/0310496 A1 | 10/2020 | Quinn et al. |
| 2020/0319674 A1 | 10/2020 | Knoppert et al. |
| 2020/0319679 A1 | 10/2020 | Knoppert et al. |
| 2020/0319681 A1 | 10/2020 | Morrison et al. |

* cited by examiner

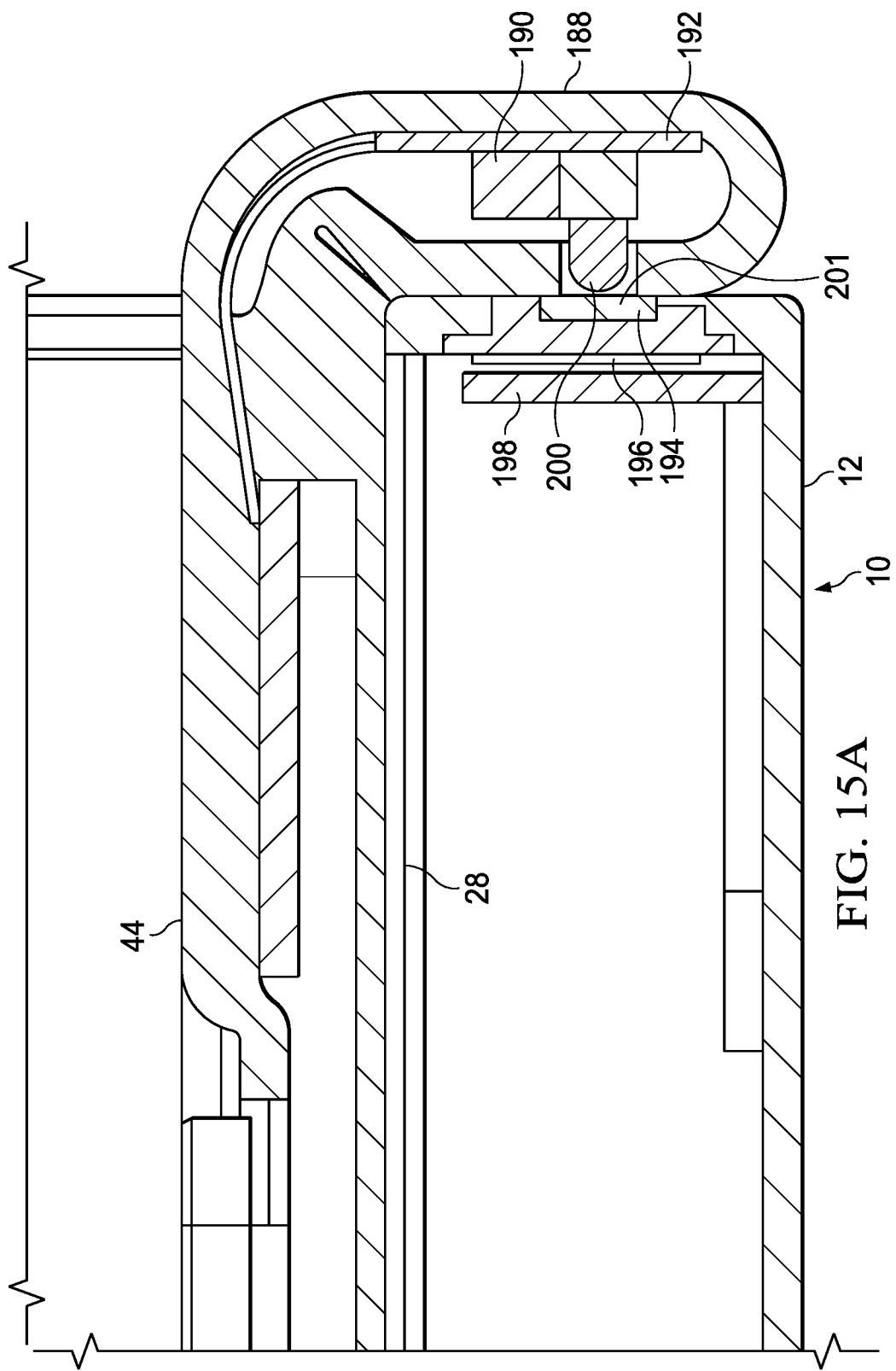

TOUCH CALIBRATION AT KEYBOARD LOCATION

CROSS-REFERENCE TO RELATED APPLICATION(S)

This application is related to application Ser. No. 16/774,138, filed Jan. 28, 2020, entitled "KEYBOARD CHARGING FROM AN INFORMATION HANDLING SYSTEM," naming Jace W. Files and John Trevor Morrison as inventors, application Ser. No. 16/774,142, filed Jan. 28, 2020, entitled "KEYBOARD MAGNETIC GUARD RAILS," naming Jace W. Files and John Trevor Morrison as inventors, application Ser. No. 16/774,133, filed Jan. 28, 2020, entitled "DYNAMIC KEYBOARD SUPPORT AT SUPPORT AND DISPLAY SURFACES," naming John Trevor Morrison and Jace W. Files as inventors, application Ser. No. 16/774,147, filed Jan. 28, 2020, entitled "SELECTIVELY TRANSPARENT AND OPAQUE KEYBOARD BOTTOM," naming Chiu Jung Tsen, John Trevor Morrison, and Jace W. Files as inventors, and application Ser. No. 16/774,149, filed Jan. 28, 2020, entitled "VIRTUAL TOUCHPAD AT KEYBOARD LOCATION," naming James D. Trim, Hari J. Iyer, John Trevor Morrison, and Jace W. Files as inventors, which applications are incorporated herein by reference.

BACKGROUND OF THE INVENTION

Field of the Invention

The present invention relates in general to the field of portable information handling systems, and more particularly to an information handling system touch calibration at a keyboard location on a display.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

One difficulty with integration of a keyboard in a portable housing is that the keyboard tends to increase the thickness or Z-height of the system. In addition, the keyboard integrates in an upper surface of the main housing opposite where a display is positioned. By replacing the keyboard with a second display, the viewing area for presenting visual images at the information handling system effectively doubles. Some portable information handling systems have a dual display configuration on opposing housing portions and support an integrated keyboard by presenting a virtual keyboard at one of the displays when the system is in a clamshell configuration. In such systems, the end user presses inputs at a touchscreen display surface over keyboard keys presented by the display and sensed by a capacitive touch detection surface integrated in the display. Although a virtual keyboard supports a clamshell configuration to accept typed inputs, end users often have difficulty typing inputs at virtual keys due to the lack of feedback from the display touchscreen input touches. As a result, end users of dual display systems tend to have peripheral keyboards available for when substantial typed inputs are needed. With the introduction of "foldable" organic light emitting diode (OLED) displays, such dual display configurations will likely grow more common as will the use of peripheral keyboards to support typed inputs where the information handling system lacks an integrated keyboard.

A number of difficulties exist with the use of a peripheral keyboard to make inputs at a dual display portable information handling system. One difficulty is that carrying a peripheral keyboard separate from an information handling system tends to be inconvenient. One solution to this difficulty recently introduced by the inventors hereof is the use of an expandable hinge to allows housing portions to close around a keyboard. An expandable hinge increases the distance between the housing portions as they contact the keyboard to allow room to hold the keyboard between the housing portions. Another difficulty is the inconvenience of holding both the information handling system and the keyboard during use of the system. One solution to this difficulty is to place the keyboard on the display so that typing may be performed similar to where the keyboard integrates in the housing. To help hold the keyboard in place, magnets of opposing polarity may be integrated in the keyboard and under the display to hold the keyboard in place on the display. When a keyboard is placed on the display, it takes up the display space and can impact touch detection surface accuracy due to signal to noise ratio disruptions that detract from the advantages of having a dual display.

Generally, including a peripheral keyboard enhances an end user experience when typed inputs are needed and detracts from that experience due to the inconvenience of carrying and maintaining the separate keyboard. For instance, a peripheral keyboard typically integrates a battery to support wireless communication of keyed inputs with an information handling system, such as Bluetooth. If the battery loses charge, the keyboard becomes essentially useless. Often end users of portable systems find keyboard backlights essential since many portable usage scenarios occur while traveling or in dark conditions. Adding a backlight to a peripheral keyboard increases power consumption and reduces battery life. Although an expandable hinge provides a convenient carrying alternative for peripheral keyboards and placing a keyboard on a display provides a convenient typing platform, contact of the keyboard against the display can lead to scratching of the display surface over time, especially as contaminates collect on the keyboard bottom surface when the keyboard is used off of the display. Further, although magnets may bias a keyboard into a fixed position on the display, magnetic interactions can introduce position instability, especially where like polarity magnets align. Such instability may result in rapid and unpredictable movements of the keyboard at the display.

SUMMARY OF THE INVENTION

Therefore, a need has arisen for systems and methods which enhance end user interactions with peripheral keyboards.

In accordance with the present invention, a system and method are provided which substantially reduce the disadvantages and problems associated with previous methods and systems for supporting end user interactions with peripheral keyboards. Peripheral keyboard placement on a display is guided by magnets disposed below the display and integrated in the keyboard, and detected by magnetic sensors or other positions sensors to adapt the operation of the information handling system and keyboard based upon the keyboard position. Various adaptations include adjusting display touch detection calibration, adjusting keyboard transparency to illuminate keys, charging the keyboard from an expanded hinge, guiding the keyboard between forward and rearward positions, and applying a virtual touchpad to detect position inputs by finger movements.

More specifically, a dual display portable information handling system processes information with processing components disposed in a housing having rotationally coupled housing portions and having a display disposed over each housing portion, such as first and second liquid crystal displays or a foldable organic light emitting diode display. A touch detection surface integrated in each display, such as a capacitive touch detection surface, detects touch inputs at a touch sensor controller for use by a processor executing an operating system and applications. Magnets with opposing polarities disposed in the keyboard and display cooperate to position the keyboard on the display, such as at forward and rearward positions, with magnetic forces from opposing polarities forming a guide rail that guides the keyboard between desired positions with smooth motion. Position detectors, such as magnetic Hall sensors detect the keyboard position to selectively adapt the information handling system and keyboard operation for detected keyboard positions. For instance, during normal operation with the keyboard positioned on the display, display touch surface calibration is paused to prevent excessive signal to noise ratio at the touch sensor from generating erratic operation. The keyboard integrates retractable feet that extend when the keyboard is not positioned on the display to reduce contaminants at the keyboard bottom surface and retract when the keyboard is positioned on the display. As another example, a virtual trackpad is provided in front of the housing by an infrared position detector when the keyboard is detected at the forward position. Keyboard illumination is provided from the display by passing through a transparent bottom surface, which transitions to an opaque surface when the keyboard is removed from the display to improve keyboard aesthetics by hiding internal components. The keyboard stores between closed housing portions with extra distance created between the housing portions by expanding a hinge. The expandable hinge exposes a charging extension upon expansion to provide a charge to an internal keyboard battery during storage. These and other adaptations to operating conditions are automatically implemented based upon keyboard position detection or manually configurable based upon end user preferences.

The present invention provides a number of important technical advantages. One example of an important technical advantage is that a dual display information handling system conveniently interacts with a peripheral keyboard to enhance an end user's experience. The keyboard stores between housing portions with an expandable hinge that incorporates battery charging to maintain keyboard readiness. In a clamshell mode, the keyboard biases between forward and rearward positions with magnets so that an end user has access to a base display in a desired manner that enhances information presentation and end user input flexibility. In the forward position, automated initiation of a virtual touchpad in front of the housing provides the end user with expected input options while providing the rearward portion of the display for output of visual images. Touch responsiveness at the base display is enhanced by adapting touch sensor controller sensitivity based upon keyboard position. Key illumination is provided in the clamshell mode by passing illumination through the keyboard from the display to minimize keyboard thickness.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 15A and 15B depict an alternative embodiment for keyboard placement and charging at an information handling system display;

DETAILED DESCRIPTION

A dual display portable information handling system manages interactions with a peripheral keyboard with magnets disposed under the displays and integrated in the keyboard. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
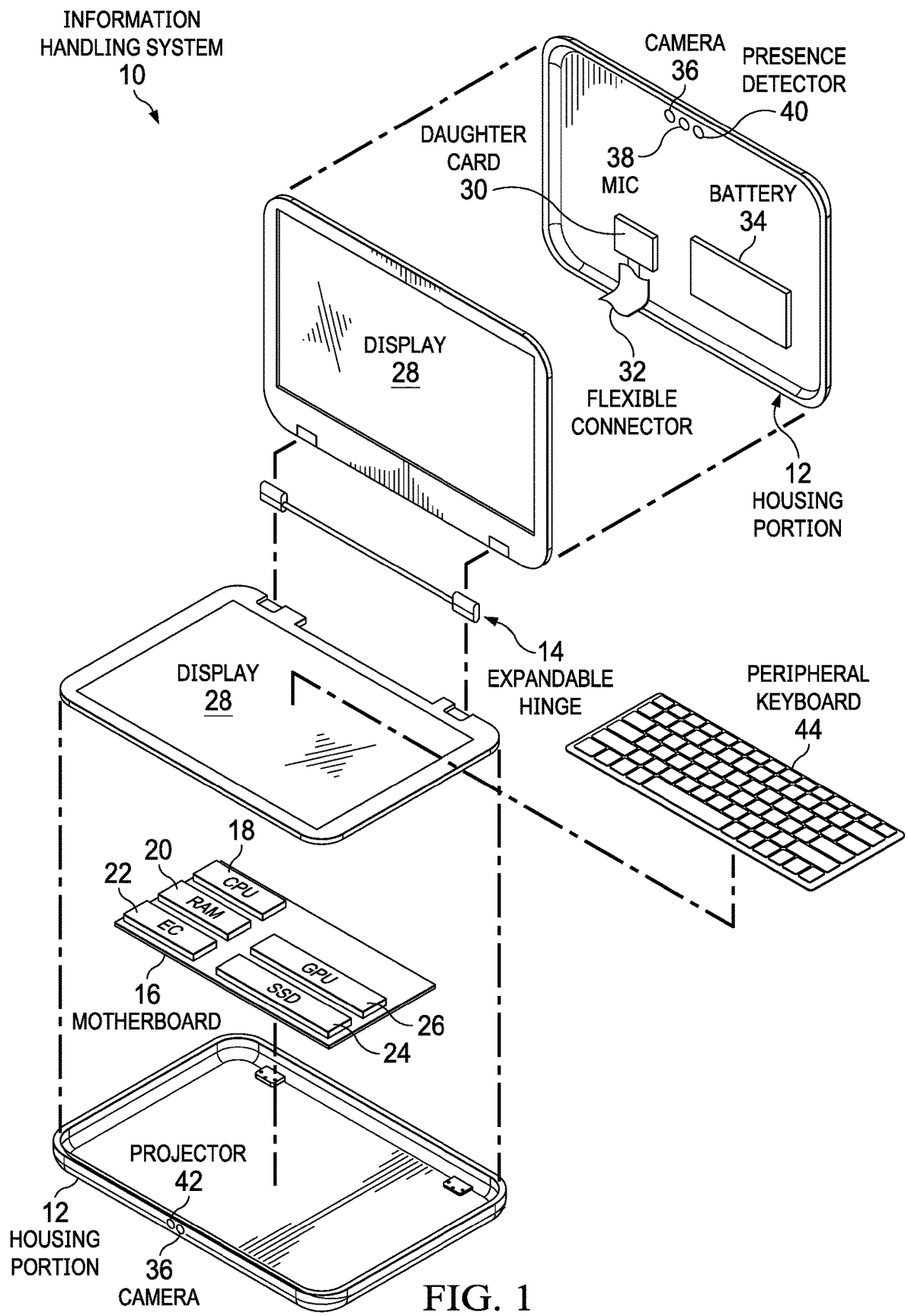
FIG. 1 depicts an exploded view of an information handling system having processing components that cooperate to process information including inputs provided through a peripheral keyboard.

Referring now to FIG. 1, an exploded view of an information handling system 10 depicts processing components that cooperate to process information including inputs provided through a peripheral keyboard 44. In the example embodiment, information handling system 10 has a portable housing with first and second housing portions 12 rotationally coupled by an expandable hinge 14. For example, the expandable hinge is an embodiment from U.S. patent application Ser. No. 16/583,794, entitled "Synchronized Dual Shaft Expandable Hinge," by Anthony J. Sanchez et al. and incorporated herein as if fully set forth. In some alternative embodiments, a non-expandable dual axle or single axle hinge may be used. The example embodiment processes information with processing components disposed on a motherboard 16, such as central processing unit (CPU) 18 that executes instructions and a random access memory (RAM) 20 that stores the instructions and information. An embedded controller 22, such as a keyboard controller, executes firmware instructions stored in flash memory that manage physical operations at the information handling system, such as power management and coordinating inputs from input devices, such as touches at a touchscreen, mouse movements and keyboard key inputs. A graphics processing unit (GPU) 26 interfaces with CPU 18 and processes the information to generate pixel values that define visual images for presentation by first and second displays 28. A solid state drive (SSD) 24 provides persistent or non-transitory memory to store information during power down cycles of information handling system 10. For example, SSD 24 stores an operating system and applications that are retrieved on power up to RAM 20 for execution by CPU 18. In various embodiments, alternative arrangements of processing components may be provided to achieve desired processing performance.

In the example embodiment, a number of components may provide inputs from an end user and/or the environment. For example, a liquid crystal display panel 28 is disposed over each housing portion 12 to present pixel values as visual images and accept touch inputs through a touch detection surface, such as a capacitive touch detection layer. For instance, touches at display 28 are detected by a touch controller and reported to embedded controller 22 as inputs based upon a calibration performed by the touch controller on a periodic basis. In the example embodiment, a flexible connector 32 supports an interface of a daughter card 30 with motherboard 16 so that processing components and input devices may be distributed between housing portions 12. A camera 36 in both of housing portions 12 may capture visual images of the environment, such as to support visual conference or detection of inputs. For example, camera 36 may include infrared illumination from a presence detector 40 or a projector 42 for depth camera functionality that detects user presence or user gesture inputs. Alternatively, projector 42 may project an image that defines an area in which camera 36 detects inputs, such as a virtual touchpad as described in greater detail below. A battery 34 included in one housing portion stores a battery charge that supports operation of information handling system 10 in a portable configuration free from external power sources. For instance, firmware stored in flash memory of embedded controller 22 manages power usage and charge by battery 34, such as by monitoring voltage and current levels related to battery discharge and charge by an integrated charger.

Figure 2A:
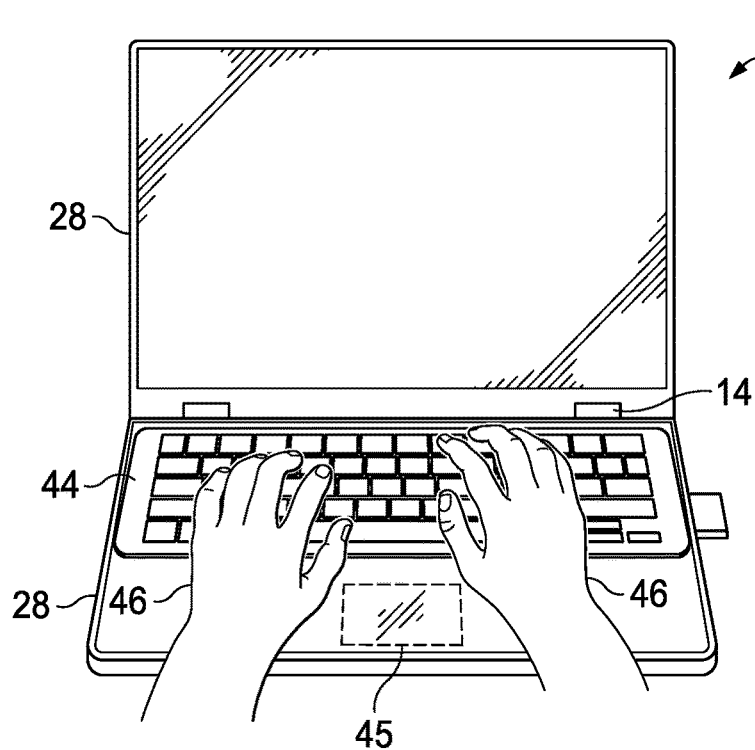
FIGS. 2A, 2B and 2C depict various positions of a peripheral keyboard placed on a display.
Figure 2B:
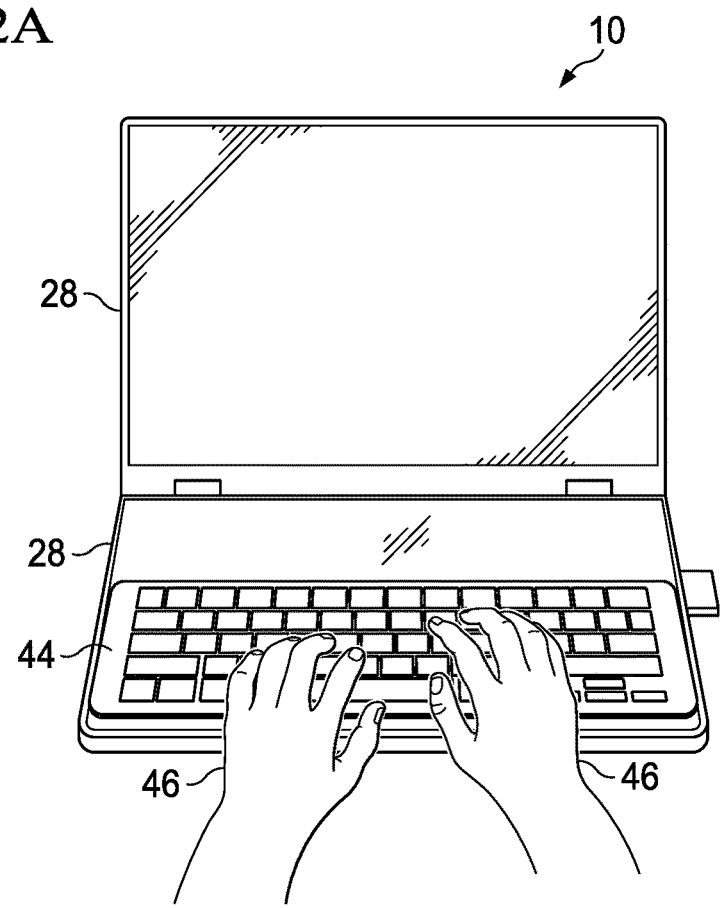
Figure 2C:
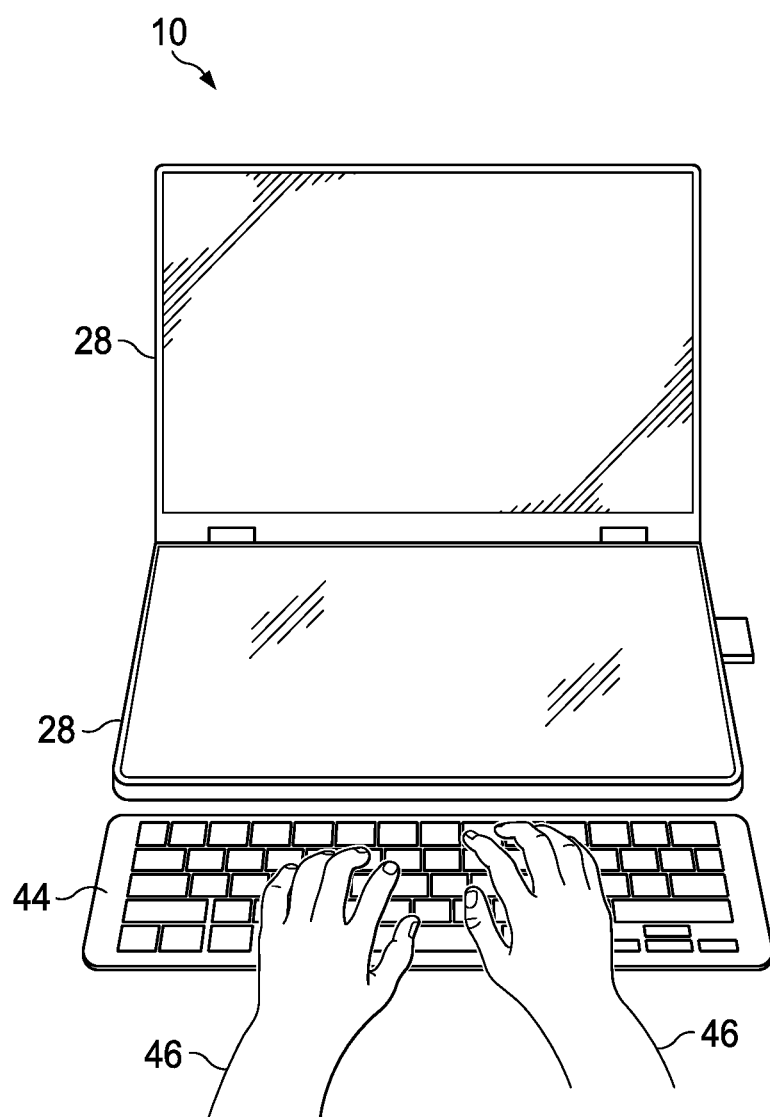

Referring now to FIGS. 2A, 2B and 2C, various positions of a peripheral keyboard 44 placed on display are depicted. Dual display information handling systems 10 have a display disposed over both housing portions 12 to provide a full housing surface area at which visual images may be presented. In the example embodiment, both displays 28 are separate liquid crystal display (LCD) panels; however in an alternative embodiment, a single foldable organic light emitting diode (OLED) display may be used that folds about hinge 14. In the clamshell configuration as depicted, the housing portions 12 rotate to a substantially perpendicular orientation so that one display 28 has a horizontal orientation and the other display 28 has a raised vertical orientation for better viewing by an end user. FIG. 2A depicts peripheral keyboard 44 at a rearward position with the rear side of keyboard 44 disposed proximate hinge 14. In the rearward position, end user hands 46 rest on the horizontal display 28 while typing inputs at the keys of keyboard 44. The forward portion of horizontal display 28 may be used to present information or user interfaces for the end user. For instance, a virtual trackpad 45 may be presented at display 28 in the location where a physical trackpad would typically be located next to an integrated keyboard. FIG. 2B depicts keyboard 44 in a forward position with the front side of keyboard 44 aligned along the front side of the horizontal display 28. In the forward position, the rear portion of horizontal display 28 may be used as additional display area, such as to present application images or system control graphical user interfaces that an end user may interact with using touches. FIG. 2C depicts keyboard 44 in a separated position resting on a support surface off of display 28. In the separated position, keyboard 44 provides an end user with a peripheral keyboard to perform inputs away from display 28. The separate configuration of keyboard 44 allows the end user to have full use of both displays 28.

In each of the rearward, forward and separated keyboard placements, the information handling system detects the position of keyboard 44 and adapts display 28 operation in response. For instance, keyboard 44 detection may be performed with the touch detection surface integrated in display 28 or with a position detector as described in greater detail below, such as Hall magnetic sensor that detects an opposing integrated magnet in proximity. Although touch detection surface of a display 28, such as an integrated capacitive sensor, aids in detection of keyboard 44 position, placement of keyboard 44 on display 28 tends to disrupt touch detection surface sensitivity. For instance, a typical capacitive touch detection surface performs a periodic calibration, such as every 160 seconds, to provide acceptable touch sensitivity for distinguishing between touch inputs and incidental touches. Placement of keyboard 44 on a touch detection surface of display 28 disrupts touch detection calibration, which can lead to choppy touch detection performance. Similarly, palm placement on a touch detection surface of display 28, such as is shown by FIG. 2A, tends to disrupt touch detection calibration accuracy. To improve touch detection calibration, embedded controller 22 monitors for placement of a keyboard on display 28 and adjusts the display calibration operations based upon the keyboard position. For example, in the rearward position embedded controller 22 commands a touch controller of the display to cease periodic calibration at the rear portion of display 28 while continuing calibration in the forward portion of display 28. In various embodiments, periodic calibration may be stopped entirely across the display with the calibration values determined at time of the placement of the keyboard stored as a reference. In another embodiment, upon detection of keyboard 44 in the rearward position, the forward portion of display 28 has a palm recognition calibration applied in anticipation of end user typing, such as a palm recognition and rejection algorithm that adapts calibration for the presence of palms placed on the forward part of display 28.

In a similar manner, keyboard 44 placement on display 28 in a forward position is detected by embedded controller 22, which commands a touch controller of display 28 to adjust calibration of the touch detection surface by ceasing calibration in the forward portion of display 28. As with the rearward keyboard position, the portions of display 28 that do not have keyboard 28 on top may continue to have touch detection calibration performed at the same interval or may also cease calibration. In one embodiment described in greater detail below, a camera and projector disposed on the side surface of housing portion 12 proximate keyboard 44 in the forward position may present a virtual touchpad on a support surface in front of information handling system 10. In both the forward and rearward keyboard positions, upon removal of keyboard 44, embedded controller 22 commands an immediate touch detection calibration to prepare the touch detection surface for accurate touch input sensing. In one alternative embodiment, upon removal of keyboard 44 from display 28 a stored touch calibration value may be applied to the touch detection surface until the next touch calibration takes place at a scheduled interval. By halting touch calibration at the location of a keyboard 44 on a display 28, unexpected over gain for signal to noise ratio touch calibration and degraded user experiences that exist between calibration intervals are avoided. Although the example embodiment addresses a stopping of calibration based upon detection of a keyboard, in alternative embodiments, calibration may be stopped at all or a portion of a display touch detection surface when an object is detected on the display. In various embodiments, an object may be identified based upon a shape detected by the touch detection surface and/or based upon detection of magnet placement at a location as described in greater detail below. As with the keyboard removal, at removal of the object from the display touch detection surface, the embedded controller commands an immediate calibration.

Figure 3:
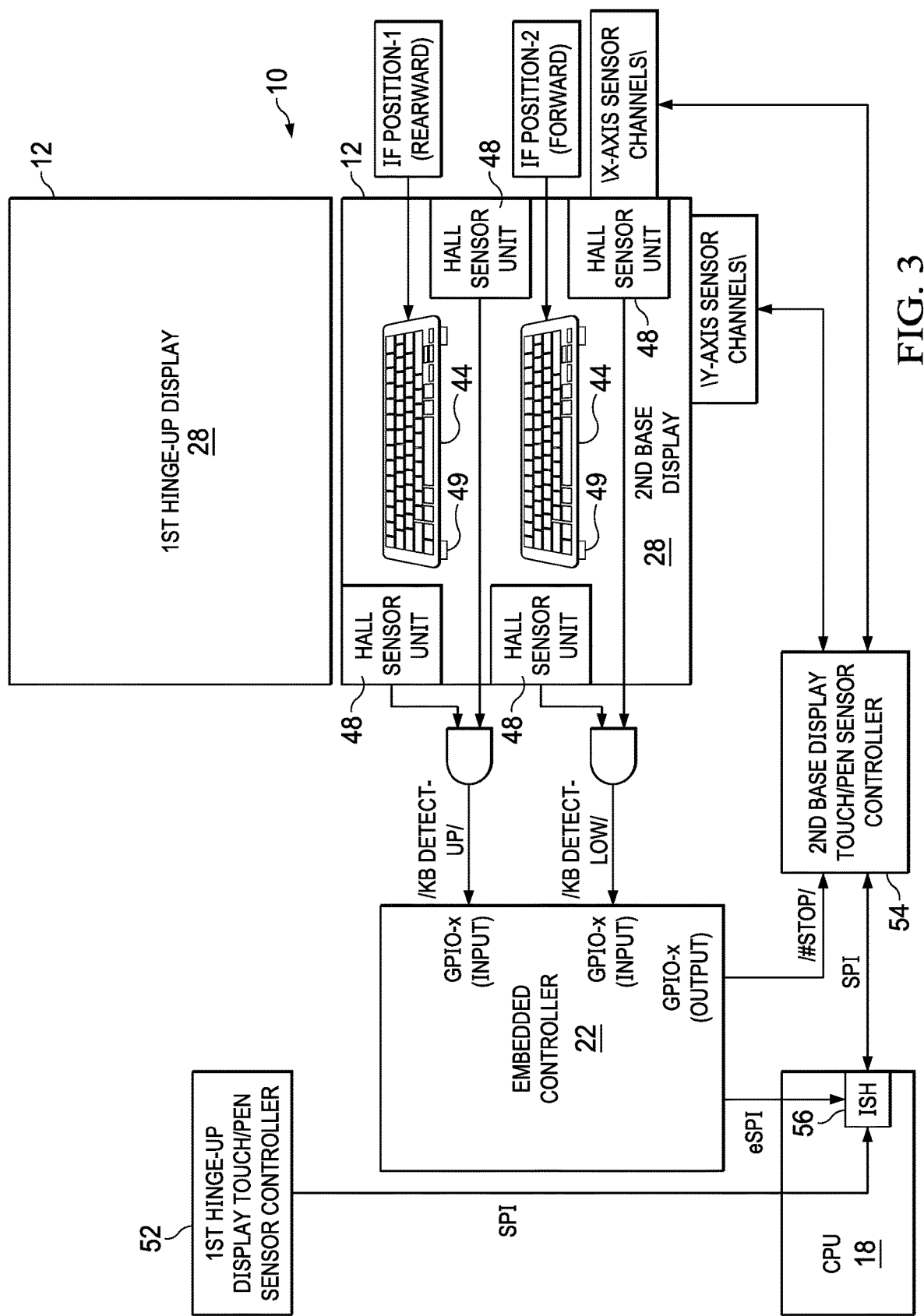
FIG. 3 depicts a block diagram of a system to manage touch detection surface calibration and keyboard placement on a display.

Referring now to FIG. 3, a block diagram depicts a system to manage touch detection surface calibration and keyboard placement on a display 28. In the example embodiment, information handling system 10 has a dual display 28 configuration with a first liquid crystal display (LCD) 28 disposed over a first housing portion 12 and second LCD 28 disposed over a second housing portion 12. Each display 28 integrates a touch detection surface, such as capacitive touch detection disposed in cover glass protecting the display panel. Touch detection at the first display is managed by a first touch sensor controller 52 and touch detection at the second display is managed by a second touch sensor controller 54. For instance, each of touch sensor controller 52 and 54 interface with wirelines integrated in the displays 28 to monitor capacitance related to nearby bodies and sensed by near field effects. In an alternative embodiment, a single OLED display may be used as described above, which would likely involve a single touch sensor controller to detect touch inputs across both housing portions. Each of touch sensors 52 and 54 periodically performs a calibration of environmental conditions at display 28 to determine a level of sensitivity at which a touch is detected versus noise, such as every 160 seconds In the example embodiment, each of touch sensor controllers 52 and 54 provide touch inputs to an integrated sensor hub (ISH) 56 of CPU 18 where an operating system and applications can have access to detected inputs. Embedded controller 22 interfaces with ISH 56, such as through a Serial Peripheral Interface (SPI) and through one or more GPIOs with touch sensor controller 54. In the example embodiment, touch calibration at the hinge up display 28 remains unchanged, however, in various alternative embodiments embedded controller 22 may interface with both displays 28 to provide touch calibration control at both displays 28.

In the example embodiment, the base display 28 integrates first and second sets of first and second Hall sensor units with one set aligned at a rearward position of keyboard 44 and the other set aligned at a forward position of keyboard 44. Keyboard 44 integrates first and second magnets 49 positioned to align with Hall sensor units 48 when keyboard 44 is placed on display 28. Each Hall sensor unit output "ands" through a logic component to provide a "high" keyboard detect signal to the GPIO at embedded controller 22 when keyboard 44 rests to align its both magnets 49 and Hall sensor units 48 in the rearward or frontward position. Embedded controller 22 executes firmware instructions from flash memory that respond to detection of keyboard 44 by commanding touch sensor controller 54 to cease periodic calibration in the region of display 28 at which keyboard 44 was detected, such as the forward or rearward position. Once keyboard 44 is removed from display 28, embedded controller 22 GPIOs return to a low state so that the firmware instructions command from embedded controller 22 to touch sensor 54 an immediate recalibration of the touch detection surface. As described above, a stored recalibration value may be used instead as may a default value. In various embodiments, magnets or other positioning techniques may be used to position keyboard 44 on display 28 at a desired location that aligns Hall sensor units 48 with positional magnets 49. Although the example embodiment depicts Hall sensors 48 to detect keyboard 44 position on display 28 with positional magnets 49, in alternative embodiments other types of positions sensors may be used including magnetic and non-magnetic position sensors. For example, in one embodiment, keyboard 44 position is detected by the touch sensor controller so that the touch sensor controller itself manages calibration itself without relying on embedded controller 22. Similarly, Hall sensor units 48 may provide output directly to touch sensor controller 54 so that logic on processing resources of touch sensor controller 54 may detect keyboard 44 and cease touch sensor calibrations. In one alternative embodiment, magnets may be located in the display with Hall sensors located in the keyboard and communicating through wireless signals to the embedded controller.

Figure 4:
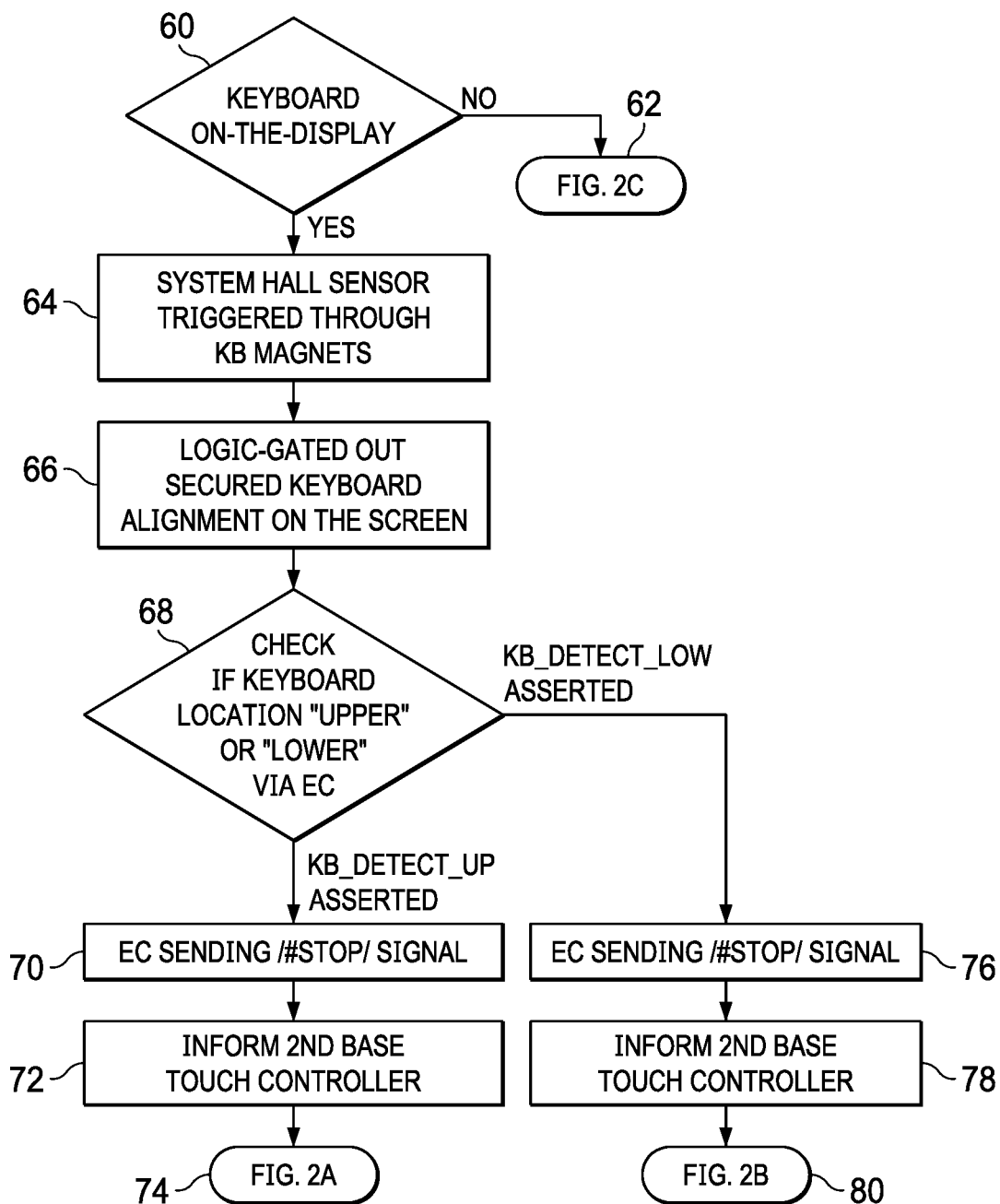
FIG. 4 depicts a flow diagram of a process for detecting a keyboard placed on a portable information handling system display.

Referring now to FIG. 4, a flow diagram depicts a process for detecting a keyboard placed on a portable information handling system display. The process starts at step 60 with a determination of whether the keyboard is placed on the display, such as by detection of positioning magnets located in the keyboard with Hall sensors located in the display. If the keyboard is not located on the display the process continues to step 62 to determine the configuration illustrated by FIG. 2C and touch detection calibration is not adjusted for the periodic schedule or other techniques that may be used to trigger calibration. If at step 60 a keyboard is detected on the display, the process continues to step 64 to check if the Hall sensors have detected the keyboard magnets. At step 66 the logic gated out of the Hall sensors is read by the embedded controller to determine if the keyboard is aligned in a forward or rearward position at step 68. If the keyboard is detected with the GPIO at the rearward position, the process continues to step 70 at which the embedded controller sends a command to the touch sensor controller at step 72 to stop calibration in the rearward position. In one example embodiment, the keyboard in the rearward position may initiate other actions, such as palm rejection calibration logic and presentation of a virtual touchpad at the display forward position. Similarly, if the keyboard is detected with the GPIO at the forward position, the process continues to step 76 at which the embedded controller sends a command to the touch sensor controller at step 78 to stop calibration in the forward position. In one example embodiment, the keyboard in the rearward position may initiate other actions, such as activation of a virtual touchpad on a support surface in front of the keyboard and external to the information handling system housing. In one example embodiment, upon a change in the output of the Hall sensors, the process returns to step 60 to locate the keyboard position.

Figure 5:
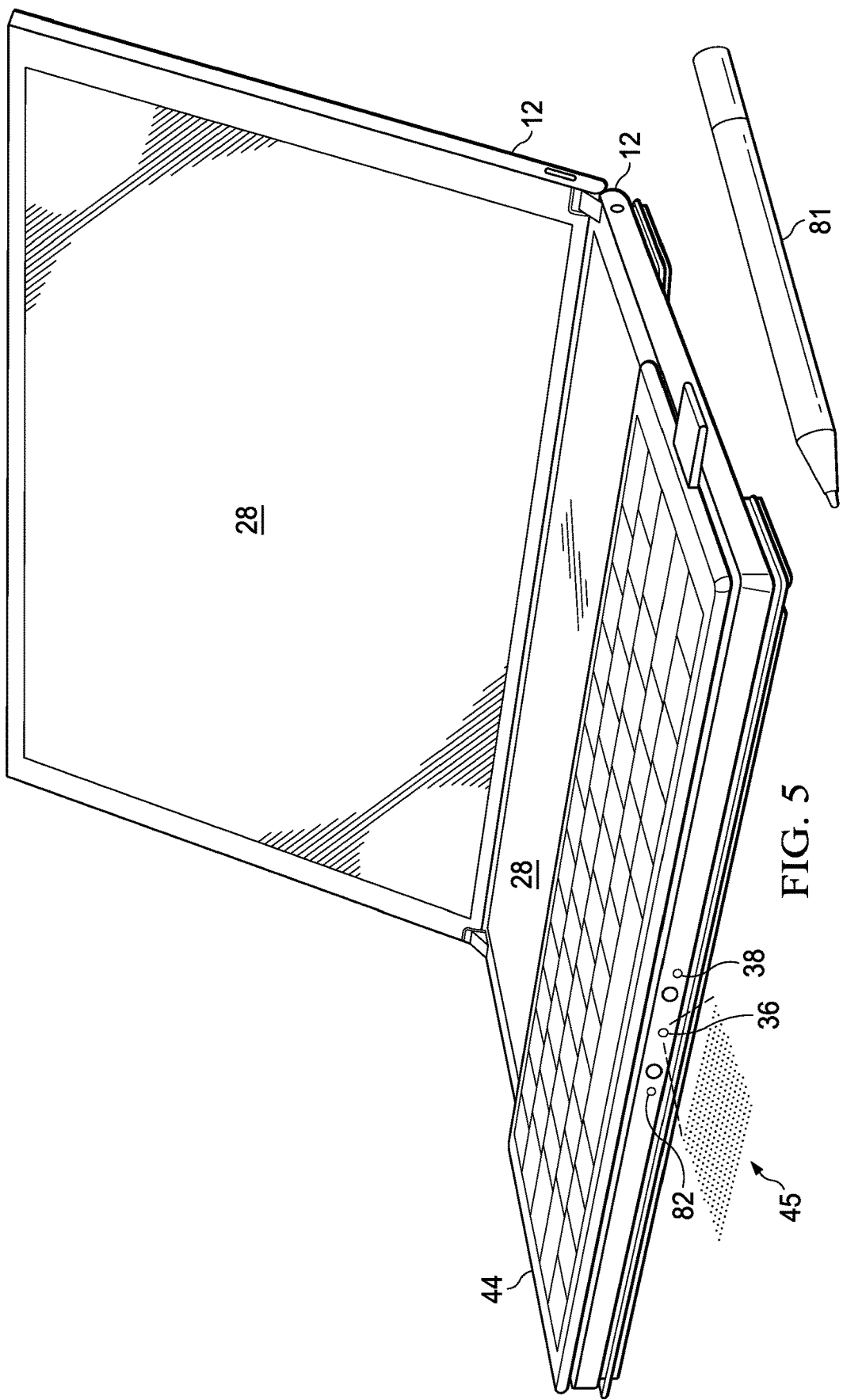
FIG. 5 depicts a side perspective view of an information handling system having a keyboard disposed at a forward position of a display and a virtual trackpad presented at a position external to and in front of the information handling system.

Referring now to FIG. 5, a side perspective view depicts information handling system 10 having a keyboard 44 disposed at a forward position of a display 28 and a virtual trackpad 45 presented at a position external to and in front of information handling system 10. An infrared position detector 82, such as a depth camera supported by an infrared transmitter, is directed towards virtual touchpad 45 and configured to interpret finger movements in the area of virtual touchpad 45 as if made on a physical touchpad. In one embodiment, virtual touchpad 45 activates automatically in response to detection of keyboard 44 in the forward position. Alternatively, virtual touchpad 45 activation may be controlled by end user inputs, such as by presenting the virtual touchpad as a configuration option at display 28 in response to detection of keyboard 44. In one example embodiment, a projector 36 illuminates a support surface area as a visual indication to the end user of the location of virtual touchpad 45 when infrared position detector 82 is active. Alternatively, projector 36 may remain off in some or all conditions, such as if accelerations detected at information handling system 10 indicate the system is in portable use without a support surface. A microphone 38 monitors audible energy to detect and report inputs at the support surface that match the sound of a finger tap on the support surface. In various embodiments, inputs from infrared position detector 82 may also be used to position virtual touchpad, such as with a press/hold/slide/release gesture, or may be used to select positioning on a right or left hand side for right or left handed users. In the example embodiment where placement of keyboard 44 on display 28 activates virtual touchpad 45, removal of keyboard 44 may deactivate virtual touchpad 45 or move the virtual touchpad to one presented on display 28 after removal of keyboard 44.

Figure 6A:
FIGS. 6A, 6B, 6C and 6D depict an example embodiment of a keyboard having selectively retractable feet that extend and retract to manage exposure of the keyboard bottom surface to contaminants.
Figure 6B:

Referring now to FIGS. 6A, 6B, 6C and 6D, an example embodiment of a keyboard 44 depicts selectively retractable feet 84 that extend and retract to manage exposure of the keyboard 44 bottom surface to contaminants. FIG. 6A depicts feet 84 extended to separate the bottom surface of keyboard 44 from a support surface. FIG. 6B depicts feet 84 retracted to within keyboard 44 so that the bottom surface of keyboard 44 rests on the support surface. In one example embodiment, four feet 84 are disposed at keyboard 44 bottom surface with one foot 84 in each corner of keyboard 44. In various embodiments, all four feet 84 retract and extend together or, if selected by an end user, a raised configuration extends keyboard rear feet while retracting the forward feet. Advantageously, extending feet 84 when off of a display helps to reduce contaminants at keyboard 44 bottom surface so that, upon placement of keyboard 44 on a display with feet 84 retracted, less risk of scratches exists from contaminants at keyboard 44 bottom rubbing against the display surface. Detection of keyboard 44 on a display may be performed at the information handling system and communicated to the keyboard, such as by Bluetooth, or may be performed at the keyboard. For instance, a Hall magnetic sensor in the keyboard or below the display detects an opposing magnet to determine the keyboard position. In one embodiment, keyboard position is confirmed by touches of the keyboard outline or the feet positions at the display so that the feet are then commanded to retract. In another alternative embodiment, the feet extend in response to accelerations detected by an accelerometer in the keyboard and/or the information handling system so that the feet displace the bottom surface from a support surface during motion. This reduces the risk of grabbing contaminants at the bottom surface and also the area of touch of the keyboard against a display. In one embodiment, accelerations are evaluated based on direction to determine a foot response, such as extending feet in response to accelerations in a horizontal plane versus a vertical plane relative to the keyboard plane.

Figure 6C:
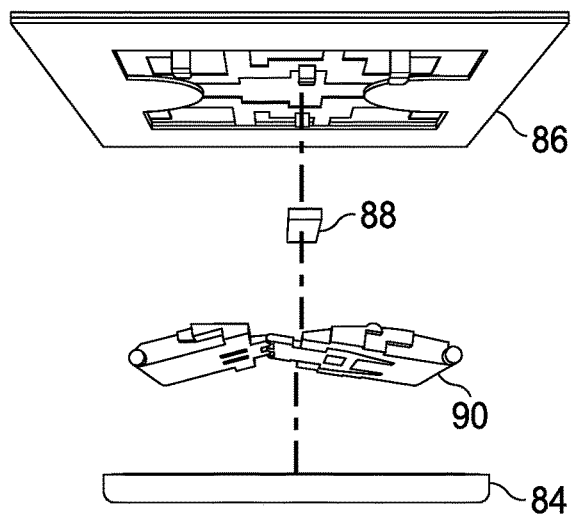
Figure 6D:
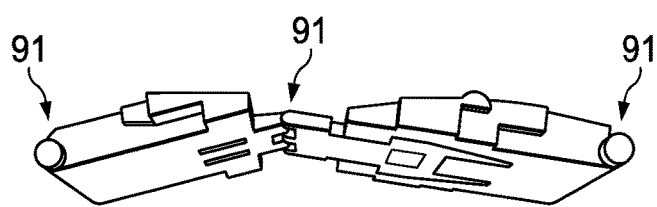

FIGS. 6C and 6D depict an example embodiment of a retraction/extension mechanism for adjusting keyboard feet. A frame 86 holds an electropermanent magnet 88 proximate a scissors mechanism 90 that pivots about three pivot locations 91. Scissors mechanism 90 couples to a foot 84, which retracts and extends based upon the movement of scissor mechanism 90. In the example embodiment, scissors mechanism 90 has an integrated spring bias away from frame 86 so that foot 84 biases to the extended position. To retract foot 84, electropermanent magnet 88 is activated to attract scissors mechanism 90 at the central pivot location upwards towards frame 86. Once electropermanent magnet 88 is deactivated, the bias of scissors mechanism 90 extends foot 84 out again. In alternative embodiments, other extension and retraction mechanisms might be used, such as a solenoid or muscle wire arrangement.

Figure 7:
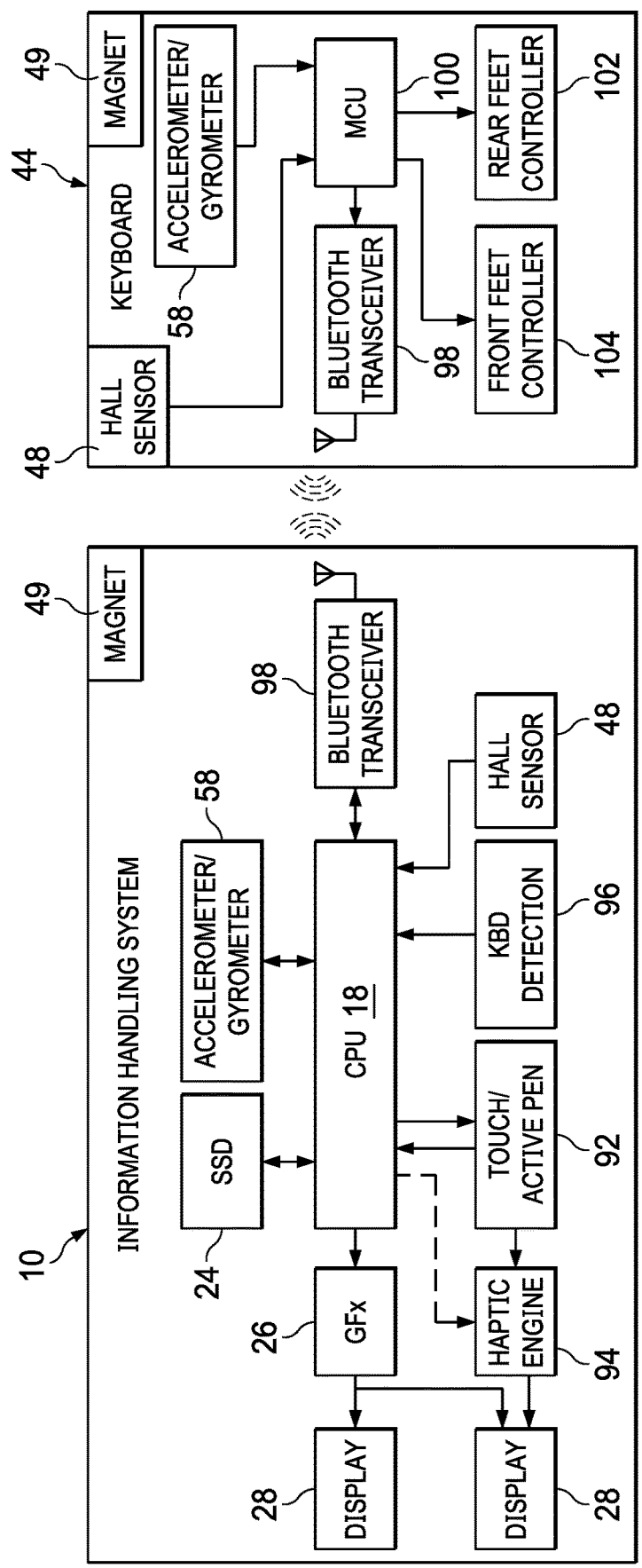
FIG. 7 depicts a block diagram of an information handling system and keyboard that communicate through wireless signals to adapt operations based upon the keyboard position relative to the information handling system display.

Referring now to FIG. 7, a block diagram depicts an information handling system and keyboard that communicate through wireless signals to adapt operations based upon the keyboard position relative to the information handling system display. Information handling system 10 processes information with CPU 18, such as by executing an operating system and applications retrieved from storage of SSD 24, to generate visual information through a graphics system 26 for presentation at dual displays 28. End user inputs are detected at displays 28 with a touch/active pen detection sensor 92 and haptic output is provided by a haptic engine 94. Operation conditions are monitored with sensors, such as an accelerometer/gyrometer 58 and keyboard detection logic 96 of an embedded controller or other processor. A Bluetooth transceiver 98, or other wireless communication device, provides communication with keyboard 44 through wireless signals. In the example embodiment, Hall sensors 48 and magnets 49 are disposed in information handling system 10 and keyboard 44 to support detection of proximity of keyboard 44 to display 28 by either device. In alternative embodiments, a position detector includes a Hall sensor 48 in just one of the information handling system or keyboard and a magnet 49 in the other.

In the example embodiment, keyboard 44 includes as a processor a microcontroller unit (MCU) 100 that executes embedded code stored in flash or other non-transient memory. MCU 100 interfaces with Bluetooth transceiver 98 communicate key inputs from keyboard 44 to information handling system 10 and to accept commands from information handling system 10. For instance, when keyboard detection logic 96 detects keyboard 44 on display 28, it sends a foot retraction command through wireless signals to MCU 100. In response, MCU 100 commands front feet controller 104 and rear feet controller 102 to retract the feet. When keyboard detection logic 96 detects keyboard 44 distal display 28, it send a foot extension command to MCU 100. In response, MCU 100 command front feet controller 104 and rear feet controller 102 to extend the feet, such as by adjusting the state of the electropermanent magnet as described above. If an end user configures keyboard 44 to have a tilt, then a command from information handling system 10 or a configuration stored at MCU 100 may extend the rear feet and retract the front feet. In addition to commands from information handling system 10, MCU 100 may determine an extension or retraction of feet based upon locally sensed conditions, such as an output of Hall sensor 48 or accelerometer 58 as described above. Although the block diagram depicts control of feet position, in alternative embodiments similar logic and communication interactions support other functions, such as keyboard lighting through a selectively transparent layer.

Figure 8:
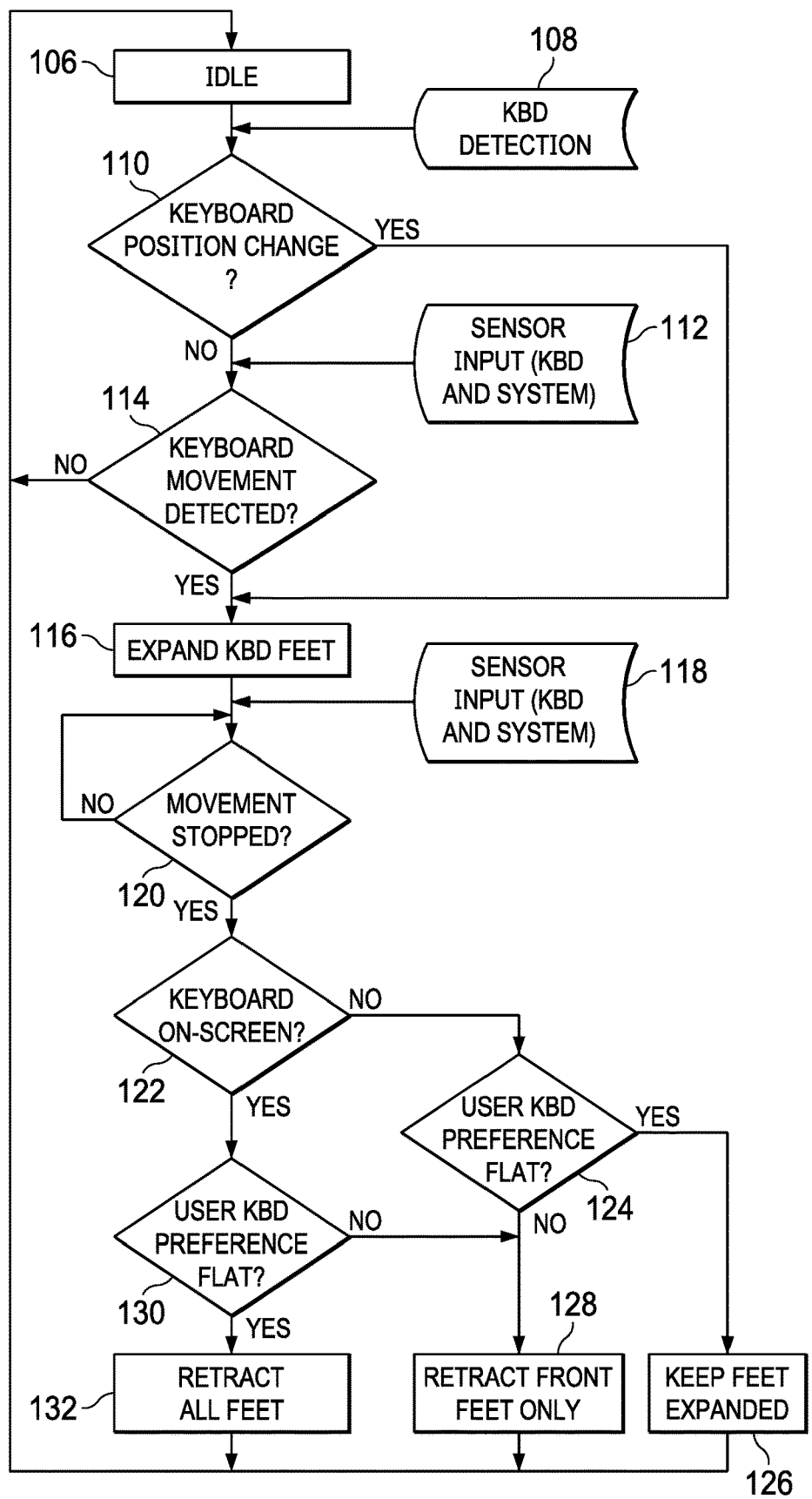
FIG. 8 depicts a flow diagram of a process for selectively extending and retracting keyboard feet based upon keyboard position relative to an information handling system display.

Referring now to FIG. 8, a flow diagram depicts a process for selectively extending and retracting keyboard feet based upon keyboard position relative an information handling system display. The process starts at step 106 in an idle state and at step 108 applies keyboard detection parameters to monitor for keyboard position relative to the display. At step 110 a determination is made of whether the keyboard position changed based upon the currently detected position. If not, the process continues to step 114 to apply sensor inputs at step 112 to determine if movement is detected at the keyboard. If the keyboard remains in the same position and no movement is detected, the process returns to step 106 to reiterate monitoring of the keyboard position and movement. If the keyboard position changed at step 110 or movement was detected at step 114, the process continues to step 116 to extend the keyboard feet outward from the keyboard bottom surface. At step 118, sensor inputs are monitored to determine at step 120 when movement stops, such as with detection of lack of accelerations for a predetermined time. Once movement has stopped at step 120, the process continues to step 122 to determine if the keyboard is positioned on the display. If not the process continues to step 124 to determine if the end user preference is for a flat keyboard or a tilted keyboard. If the end user prefers a flat keyboard, the process continues to step 126 to keep all feet extended. If the end user prefers a tilted keyboard, the process continues to step 128 to retract the front feet while leaving the rear feet extended. If at step 122 the keyboard is determined to be on the display, the process continues to step 130 to determine if the end user preference is for a flat keyboard on the display. If not, the process continues to step 128 to retract the front feet only. If the end user prefers a flat keyboard, the process continues to step 132 to retract all of the feet. The keyboard position and movement monitoring then reiterates by returning to step 106.

Figure 9A:
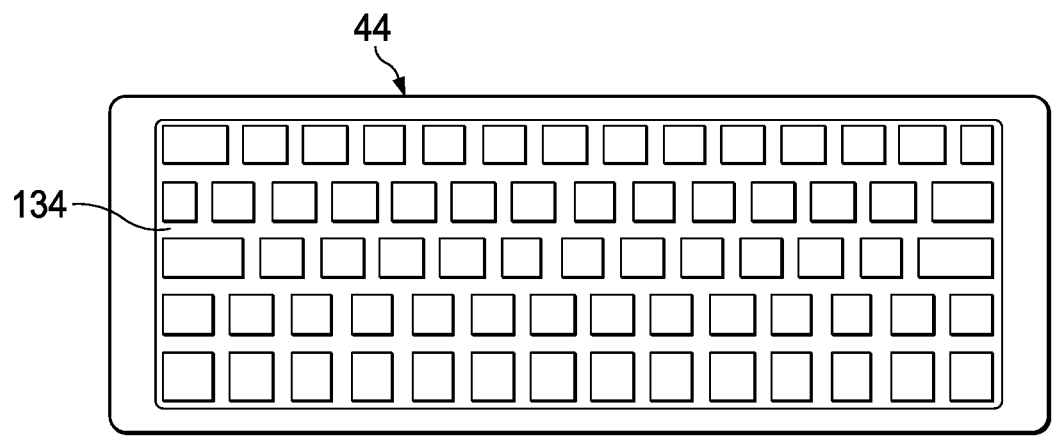
FIGS. 9A and 9B depict a bottom view of a keyboard having a selectively opaque lower keyboard surface in a transparent configuration and an opaque configuration.
Figure 9B:
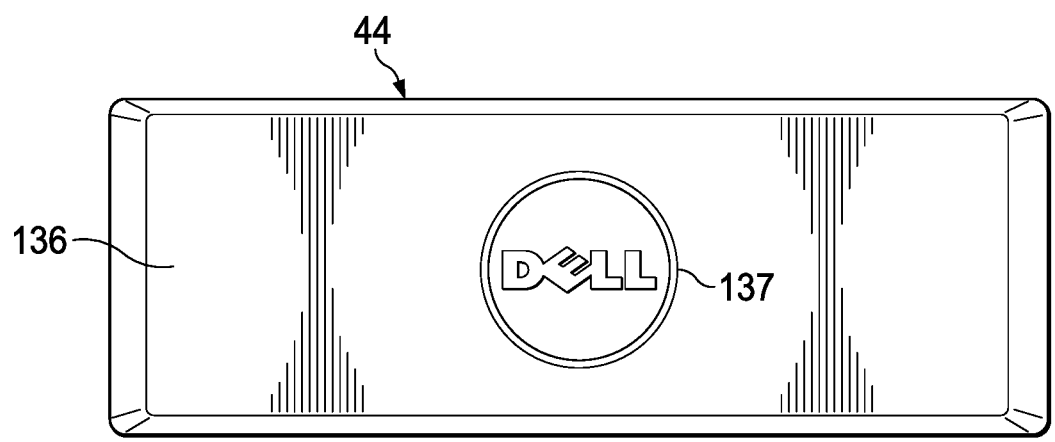

Referring now to FIGS. 9A and 9B, a bottom view of keyboard 44 depicts a selectively opaque lower keyboard surface in a transparent configuration and an opaque configuration. In FIG. 9A, a selectively opaque layer has a transparent configuration so that keys 134 are visible from the lower side. In this transparent configuration, light from a display under keyboard 44 passes from the bottom surface to illuminate keys 134, much as a conventional backlight might do. A display under keyboard 44 may generate illumination in an efficient manner, such as by detecting the keyboard position and providing a measured amount of illumination sufficient to illuminate the keys without consuming excess power. In one example embodiment, the display may produce illumination with a pixel pattern that outlines keys 134 while pixels under the keys remain dark. If the display uses OLED pixels, color may be selected for illumination under the keyboard so that pixels have OLED material degradation balanced. In FIG. 9B, the selectively opaque layer at bottom surface 136 is configured to an opaque state with a trademark icon 137 drawn by the selectively opaque layer in a central location. When backlight at keys 134 is not necessary or practical, such as when keyboard 44 is off of the display, transitioning to an opaque state hides the internal key mechanisms that might detract for appearances of keyboard 44. In the example embodiment, the opaque state is created by activating an electronic ink that draws the trademark icon 137.

Figure 10:
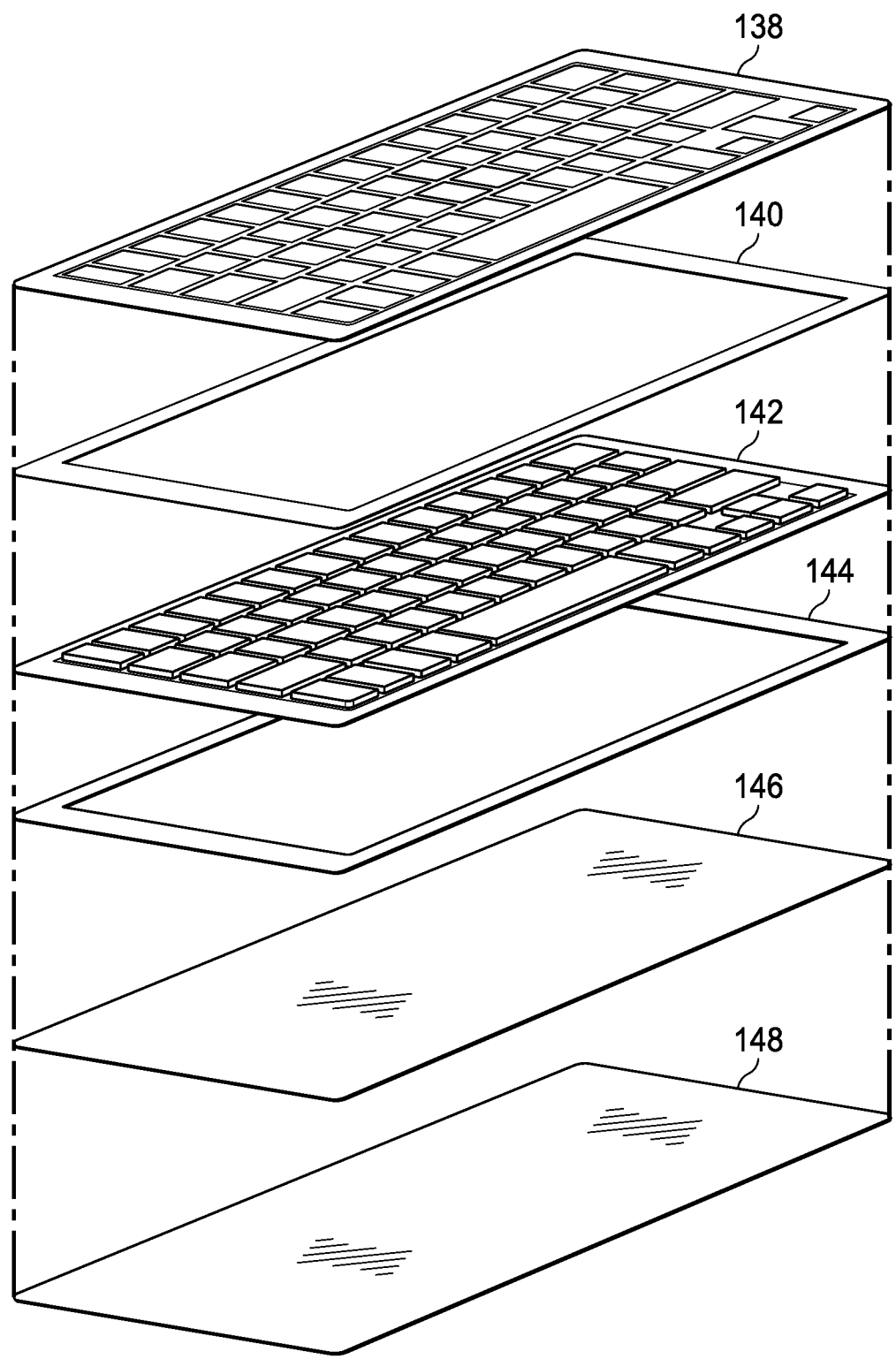
FIG. 10 depicts an exploded view of a keyboard having a selectively opaque layer and a transparent layer.

Referring now to FIG. 10, an exploded view depicts a keyboard 44 having a selectively opaque layer 146 and a transparent layer 148. A top key cover 138 fits over a main frame 140 and keyboard module 142, which contains the keys, MCU, wireless radio, sensors and flash memory with illumination logic. A bottom frame 144 captures keyboard module 142 and couples to main frame 140. A selectively opaque layer 146 couples to the bottom surface of keyboard module 142 and is captured within a bottom glass transparent layer 148. The selectively opaque layer 146 acts as a shutter film that changes transparency to adjust the amount of light that passes from below the keyboard and through keyboard module 142. A variety of types of materials may be used for the selectively opaque layer including electronic ink, liquid crystals and other materials controllable by the MCU.

Figure 11:
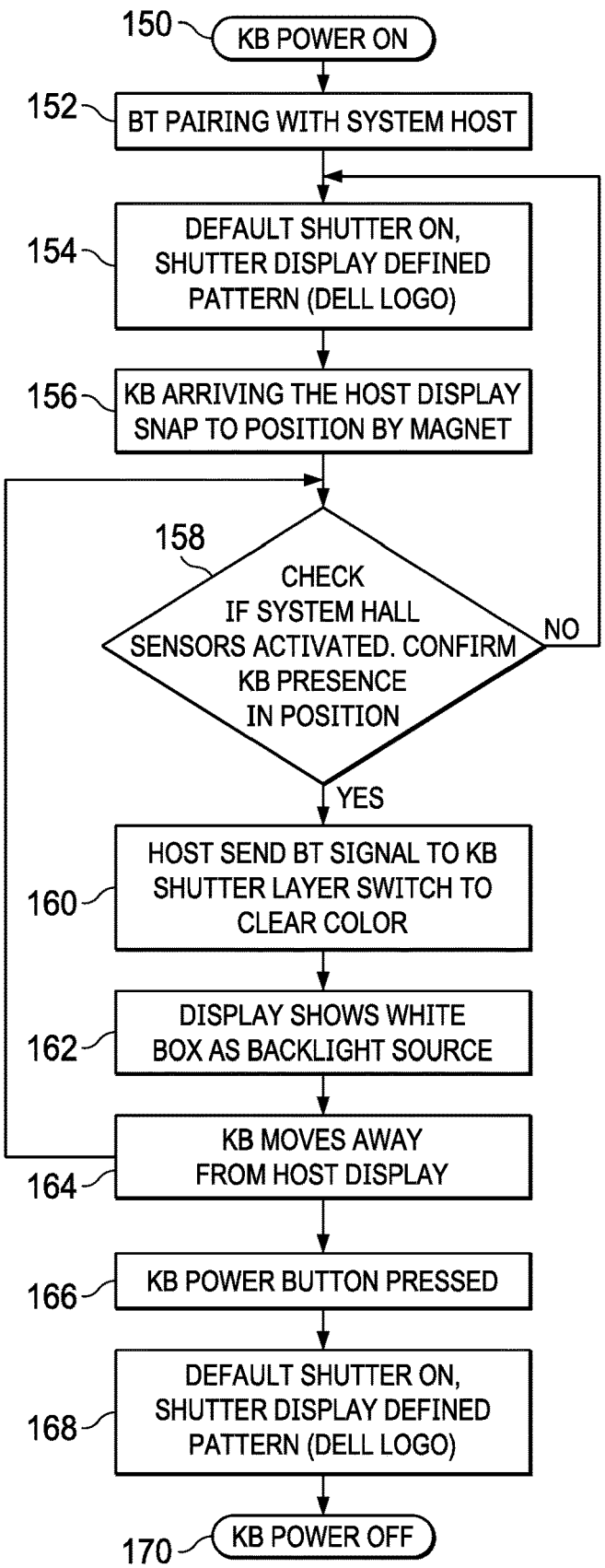
FIG. 11 depicts a flow diagram of an example process for managing the transparency state of a selectively opaque layer at a keyboard bottom surface.

Referring now to FIG. 11, a flow diagram depicts an example process for managing the transparency state of a selectively opaque layer at a keyboard bottom surface. The process starts at step 150 with power on at the keyboard. At step 152, the keyboard pairs Bluetooth with the host information handling system. At step 154, a default transparency state is applied at the selectively opaque layer, such as having an opaque state with a logo icon presented at the bottom surface. At step 156, the keyboard is placed on the host information handling system and biased into position by position magnets of opposing polarity disposed in the keyboard and display. At step 158, a determination is made of whether Hall sensors in the host information handling system detect magnets of the keyboard. In an alternative embodiment, the Hall sensors may be located in the keyboard to detect magnets under the display. At step 160, the host information handling system sends a Bluetooth signal to the keyboard selectively transparent layer to transition to a transparent state that allows illumination from the display through the keyboard. At step 162, the display illuminates white light with an intensity sufficient to illuminate the display keys, such as with a brightness selected by the end user. At step 164 the keyboard is detected moving away from the display, such as with a change in Hall sensor output or removal of the keyboard as an object placed on the display touchscreen. The process returns to step 158 where removal of the keyboard returns the process to step 154 with a transition of the selectively opaque layer to an opaque state. At step 166, once the keyboard power button is pressed or the keyboard powers down from inactivity the process continues to step 168 to default to the opaque state that presents the product logo on the back side. In various embodiments, end users may also control the selectively opaque layer to reduce illumination when the keyboard is on the display, such as by sending a configuration command to the keyboard that maintains the opaque state when on the display.

Figure 12A:
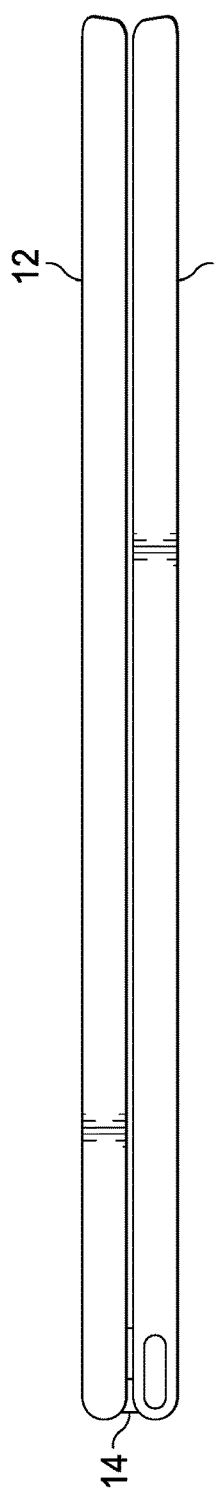
FIGS. 12A, 12B, 12C and 12D depict side views of an information handling system storing a keyboard between closed housing portions and aligned to couple the keyboard with a charging extension.
Figure 12B:
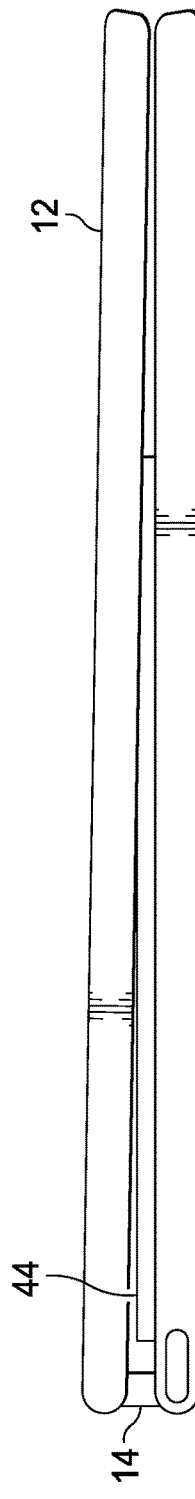
Figure 12C:
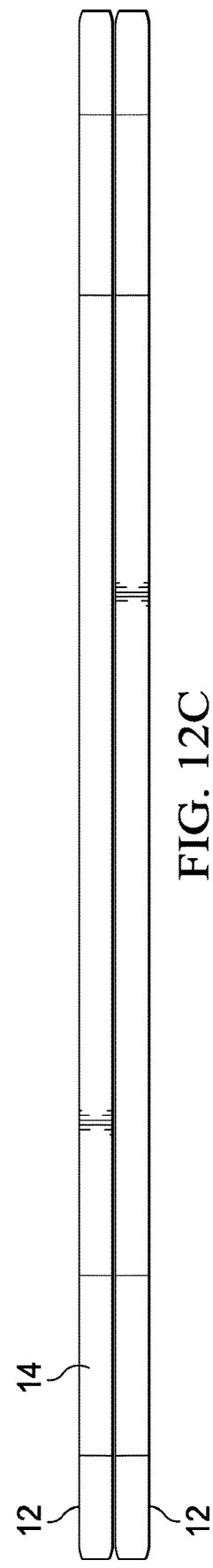
Figure 12D:
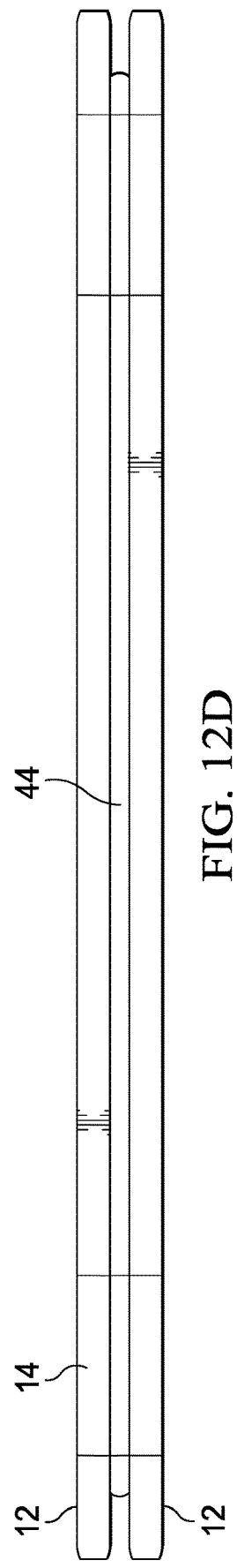

Referring now to FIGS. 12A, 12B, 12C and 12D, side views of an information handling system depict storage of a keyboard between closed housing portions and aligned to couple the keyboard with a charging extension. FIG. 12A depicts a left side view of information handling system 10 having housing portions 12 rotated to a closed position about hinge 14. FIG. 12B depicts the left side view where housing portions 12 have rotated about hinge 14 to a closed position over top of keyboard 44. Similarly, FIG. 12C depicts a rear side view of information handling system 10 with housing portions 12 closed about hinge 14. FIG. 12D depicts housing portions 12 closed over keyboard 44. Hinge 14 expands to increase the distance between housing portions 12 when keyboard 44 is between the housing portions during rotation to the closed position. A variety of different expandable hinge may provide this functionality as described in greater detail in U.S. patent application Ser. No. 16/583,794, entitled "Synchronized Dual Shaft Expandable Hinge," by Anthony J. Sanchez et al. and incorporated herein as if fully set forth.

Figure 13:
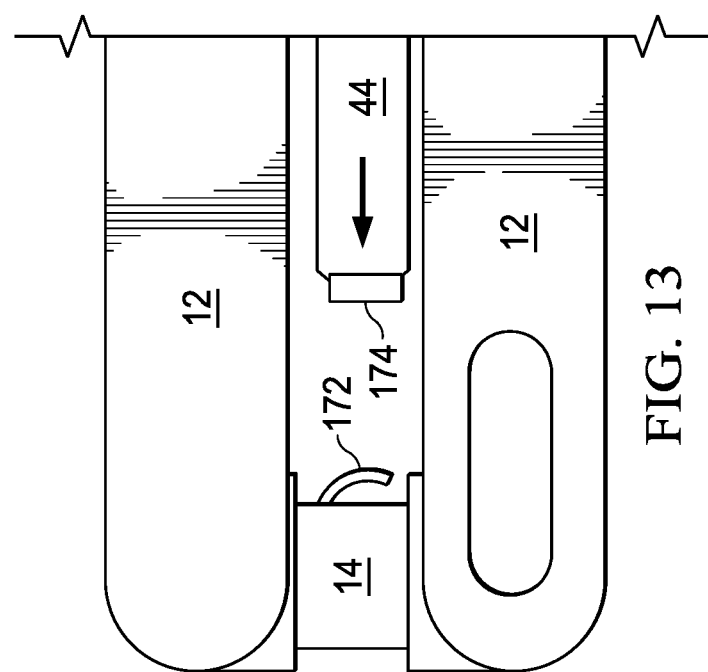
FIG. 13 depicts a side view of an information handling system having a charging extension of the expandable hinge aligned with a charging port of a keyboard disposed between closed housing portions.

Referring now to FIG. 13, a side view of information handling system 10 depicts a charging extension of the expandable hinge aligned with a charging port of a keyboard disposed between closed housing portions. In the example embodiment, expandable hinge 14 has increase the distance between housing portions 12 to create room for keyboard 44 between housing portions 12. As expandable hinge 14 expands, charging extension 172 is released and biases outward towards charging port 174 of keyboard 44. As indicated by the arrow, keyboard 44 is biased towards alignment of charging port 174 with charging extension 172 with opposing polarity positioning magnets disposed in keyboard 44 and under display 28. In addition, keyboard detection logic interfaced with Hall sensors detect the presence of the keyboard so that power is made available at charging extension 172 when keyboard 44 is present. Other charging logic may include a check of the information handling system battery charge and external power availability to see if power is available to charge the keyboard battery and a check of the keyboard charge state to see if the keyboard battery needs additional charge. In one example embodiment, coordination of keyboard 44 charging is performed through wireless communications. In the example embodiment, charge is provided from charging extension 162 while ground is provided by other keyboard to housing metal contact. Alternatively charging extension 172 may include both charge and ground, or two separate charging extensions 172 may be used with one providing charge and the other ground.

Figure 14A:
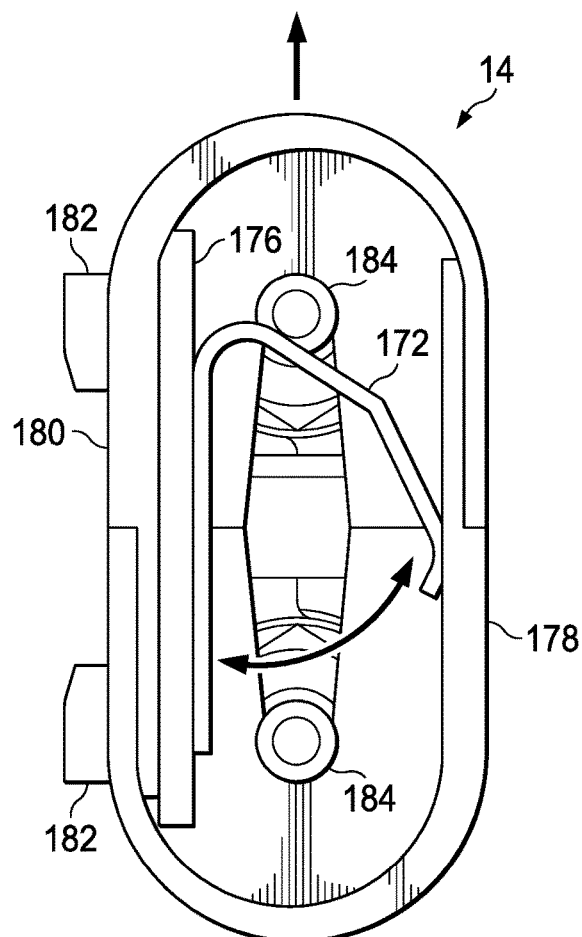
FIGS. 14A, 14B, 14C and 14D depict various views of an expandable hinge's extension and retraction of a charging extension based upon hinge position.
Figure 14B:
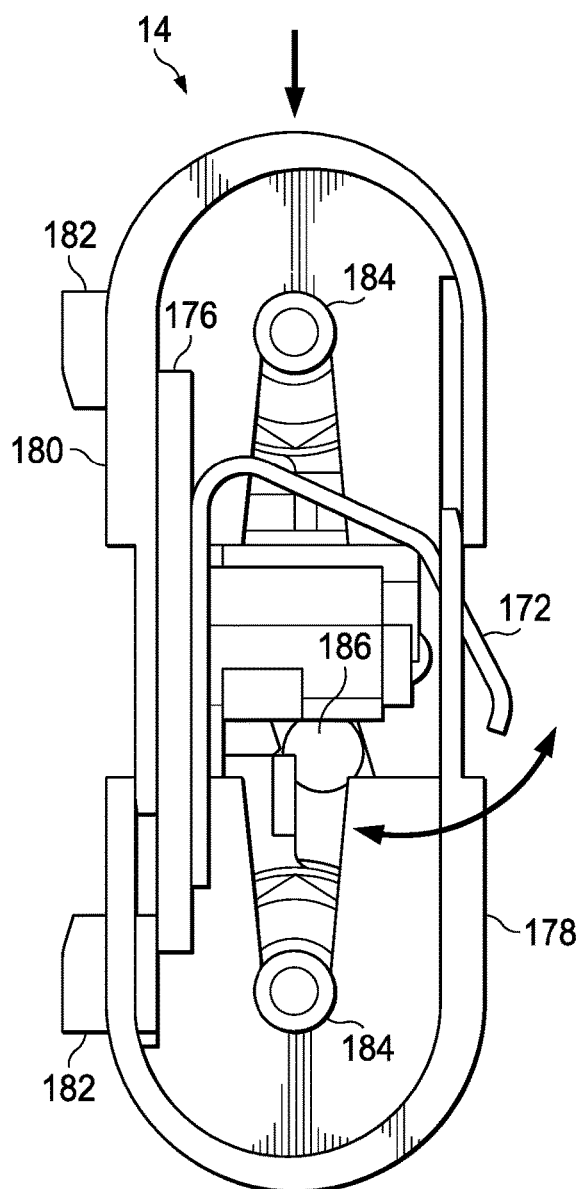

Referring now to FIGS. 14A, 14B, 14C and 14D, various views of an expandable hinge depict extension and retraction of a charging extension based upon hinge position. FIG. 14A depicts a side view of hinge 14 in an unexpanded state at which hinge 14 defaults during normal operations. A power anchor 176 couples to the rear inner side of hinge 14 an interfaces power from information handling system 10 to charging extension 172. An upper hinge housing portion 180 slidingly couples to a lower hinge housing portion 178 to hold dual axles 184 biased to a non-expanded spacing. Each axle 184 couples to a housing portion with a bracket 182. FIG. 14B depicts hinge 14 in an expanded state with an expansion mechanism 186 sliding upper and lower hinge housing portions 178 and 180 apart from each other to expose an opening in lower hinge housing portion 178.

Figure 14C:
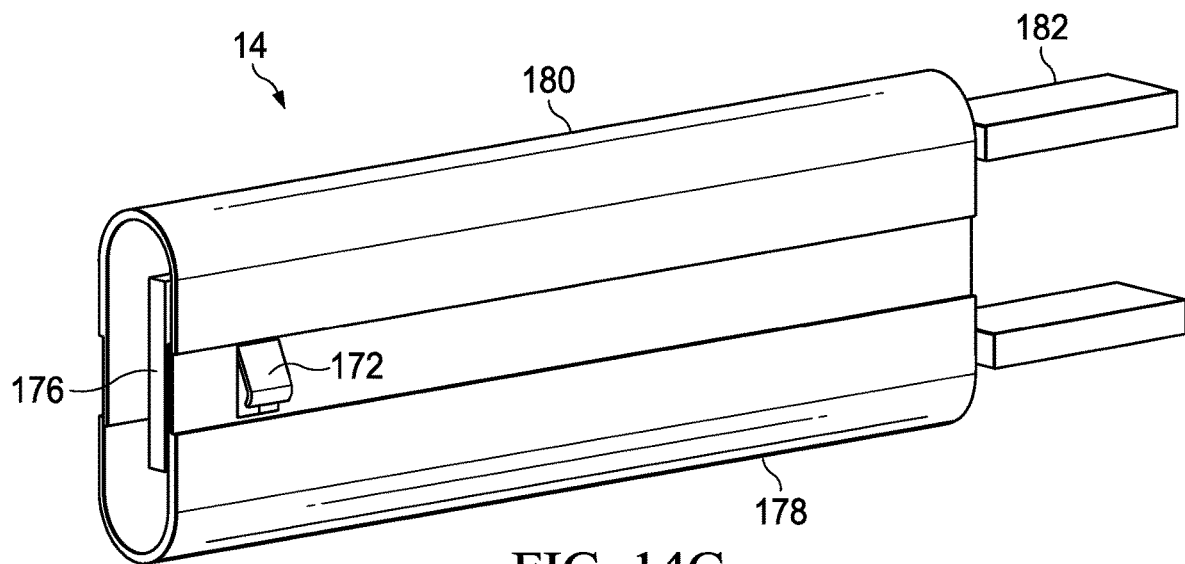
Figure 14D:
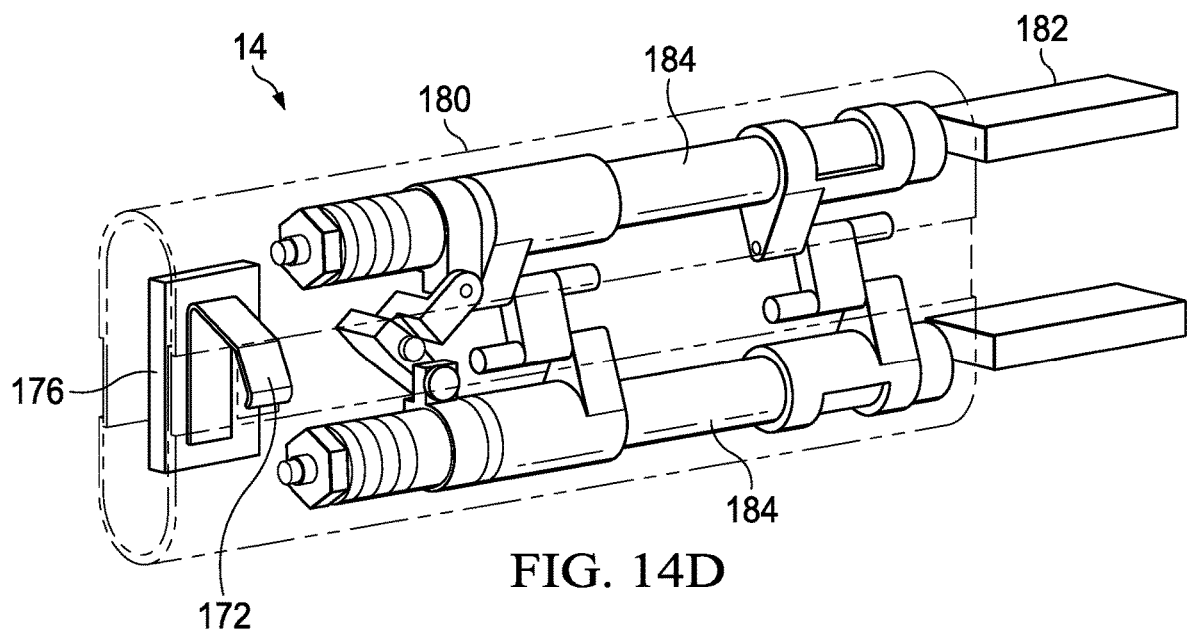

Charging extension 172 has a leaf spring form that extends through the opening to project outwards and against the keyboard charging port. FIG. 14C depicts a side perspective view of an example embodiment of hinge 14 in an expanded state with charging extension 172 extending outward. FIG. 14D depicts a cutaway side perspective view of the hinge in the expanded state. In one embodiment, charging extension 172 has power physically restrained, such as with a hard switch, until charging extension 172 is clear of the hinge housing.

Figure 15B:
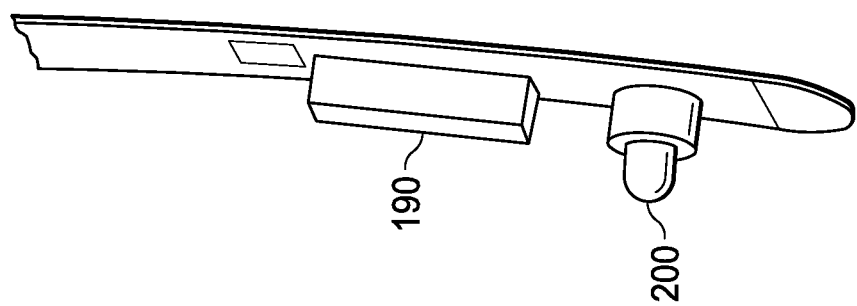

Referring now to FIGS. 15A and 15B, an alternative embodiment for keyboard 44 placement and charging is depicted. FIG. 15A depicts a side cutaway view of information handling system 10 with keyboard 44 placed on top of display 28. Keyboard 44 has a foldable flange 188 that extends past the side edge of housing portion 12 to fold over and against the side of housing portion 12. Inside of housing portion 12 a steel bracket 198 provides an attraction base for a magnet 190 of flange 188 to press flange 188 against the side of housing portion 12. An insulated molded contact strip 194 integrates a force sensitive resistor (FSR) 196 to detect pressure when flange 188 presses against the side of housing portion 12 due to the magnetic attraction. FIG. 15B depicts magnet 190 and a pogo pin 200 that accepts a charge from a charging port 201. For example, pressure sensed by FSR 196 is communicated to embedded controller in information handling system 10 to authorize charge at port 201 and into keyboard 44 through pogo pin 200. In one embodiment, deflection caused by magnet 190 at the mounting surface of pogo pin 200 releases pogo pin 200 to press outward and against charging port 201.

Figure 16:
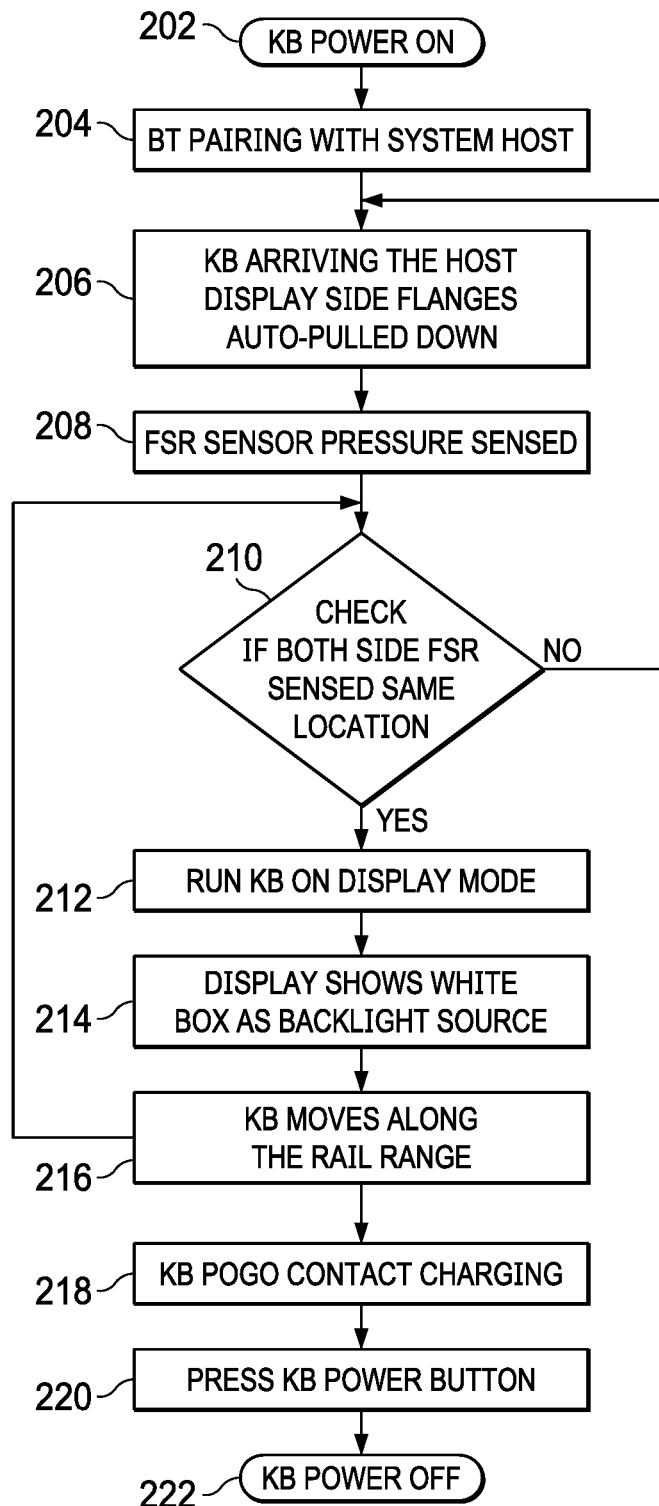
FIG. 16 depicts a flow diagram of a process for charging a keyboard disposed on a display from an information handling system.

Referring now to FIG. 16, a flow diagram depicts a process for charging a keyboard disposed on a display from an information handling system. The process starts at step 202 with power applied to the keyboard and continues to step 204 with Bluetooth pairing between the keyboard and information handling system. At step 206, the keyboard arriving at the host display with the side flanges pulled against the side of the housing by magnetic attraction. In an alternative embodiment, the keyboard is attracted by opposing magnets under the display and integrated in the keyboard. At step 208 the FSR sensor detects the presence of the keyboard based upon the pressure of the keyboard pressed against the side of the housing. In an alternative embodiment, keyboard presence is detected by other position detectors, such as a Hall sensor that detects a magnet aligned in an opposing housing.

At step 210, a determination is made of whether the FSR detects pressure from flanges on both of opposing side surfaces of the housing. If not, the process returns to step 206 to continue monitoring for full placement of the keyboard on the display. At step 212, the keyboard is run in the on-display mode with a forward or rearward position determined by the position of pressure on the FSR. At step 214 illumination is provided to the display by presenting a white box at the display matching the keyboard size and position. At step 216, movement of the keyboard along the rail returns the process to step 210 to adjust the keyboard operating conditions. At step 218, the keyboard pogo pin rests against housing charging port to initiate charging of the keyboard battery with power provided from the information handling system. At step 220 the keyboard the keyboard power button is pressed off and at step 222 the keyboard powers off.

Figure 17:
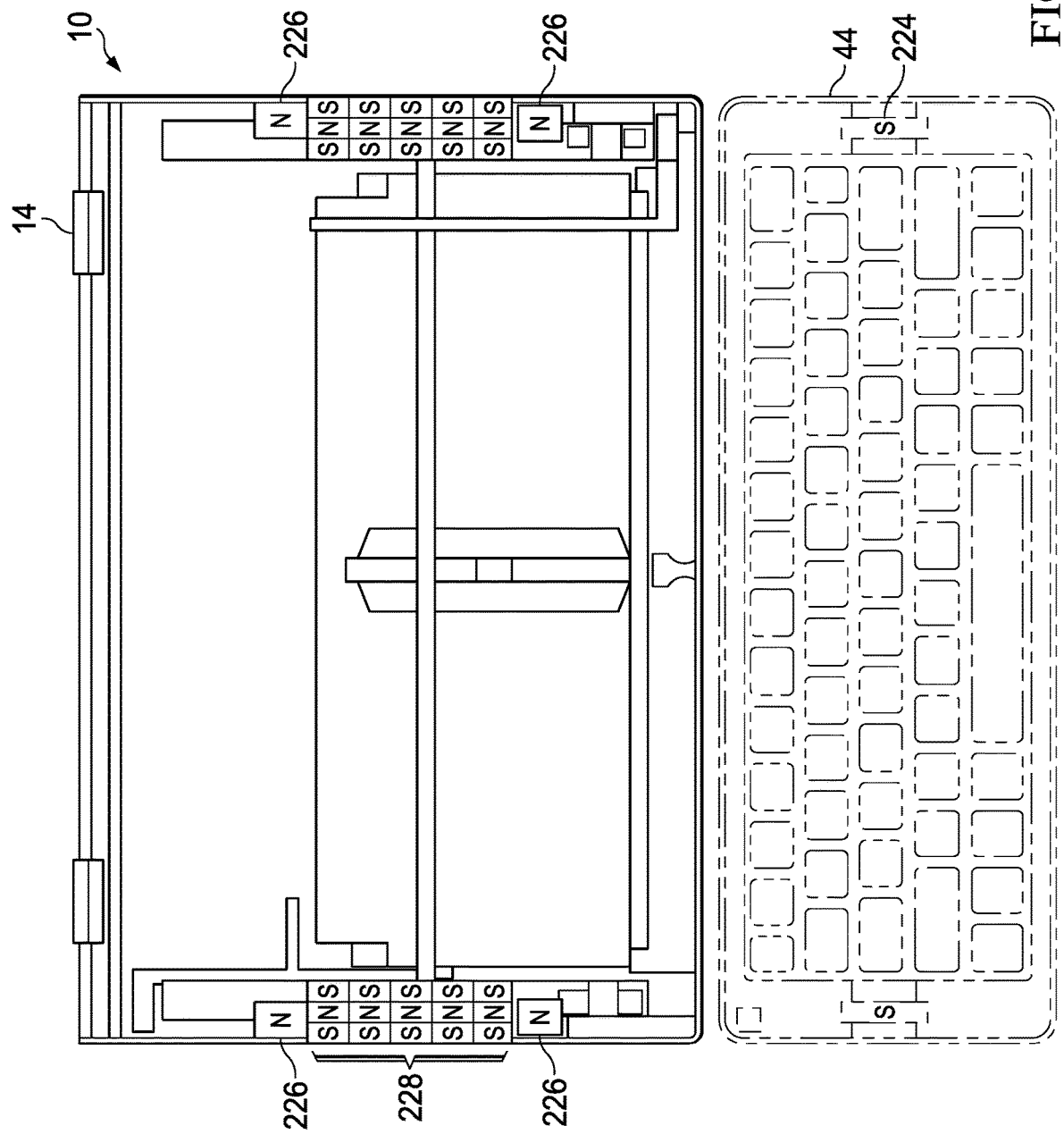
FIG. 17 depicts a top cutaway view of an arrangement of opposing magnets arranged to cooperatively move a keyboard between forward and rearward positions.

Referring now to FIG. 17, a top cutaway view depicts an arrangement of opposing magnets arranged to cooperatively move keyboard 44 between forward and rearward positions. Keyboard 44 integrates first and second anchor magnets 224 on opposing sides with a south polarity orientation at the bottom surface. Information handling system 10 integrates first and second sets of detent magnets on opposing sides with a north polarity orientation at the display surface. In the forward position, anchor magnets 224 align with the forward detent magnets 226 to bias to a position having keyboard 44 front side aligned with the front edge of housing portion 12 and distal hinge 14. For instance, in the forward position, the front portion of the display 28 is covered and a virtual touchpad activates at the front part of housing portion 12. In the rearward position, anchor magnets 224 align with the rearward detent magnets 226 to bias to a position having keyboard 44 rear side aligned with the rear edge of housing portion 12. For instance, in the rearward position a charging port of keyboard 44 aligns with and against a charging extension of hinge 14. Although the example embodiment described above hides the charging extension when the hinge does not expand, an alternative embodiment may expose the charging extension in the clamshell position to enable charging during operation.

One difficulty with a magnetic anchor and detent arrangement as depicted by FIG. 17 is that movements of keyboard 44 away from a detent position can result in rotational motion of the keyboard across the display. This motion can be disconcerting for an end user and also result in unnecessary wear against the display surface. To aid in managing keyboard motion between the forward and rearward positions, a magnetic guide rail 228 is disposed between the detent magnets 226 on each side of display 28. Each magnetic guide rail 228 has three rows of magnets. A central row of magnets matches the polarity alignment of detent magnets 226, a north polarity in the example embodiment. The outside two rows of magnets have a polarity opposite the central row, which matches the polarity of anchor magnets 224. As a result, when keyboard 44 moves from alignment of anchor magnets 224 with a first set of detent magnets 226 to a second set of detent magnets 226, the central row of magnets of magnetic guide rail 228 guide the keyboard between the detent positions while the outer rows bias the keyboard to stay in a linear path. As a result of the magnetic forces of magnetic guide rail 228, keyboard 44 tends to remain in a perpendicular configuration relative to the front and rear sides of housing portion 12. Although the example embodiment shows north and south polarity alignments, south and north alignments may be used instead. Further, the polarity on one side of display 28 may be north and south while the polarity on the other side is south and north. In this example embodiment and other example embodiments above, the implementation shown for one display 28 may be mirrored in the dual display. For instance, detent magnets 226 and guide rails 228 may be included in both displays 28 of a dual display information handling system 10 so that the end user can use either display as the base in a clamshell mode on which keyboard 44 rests.

Figure 18A:
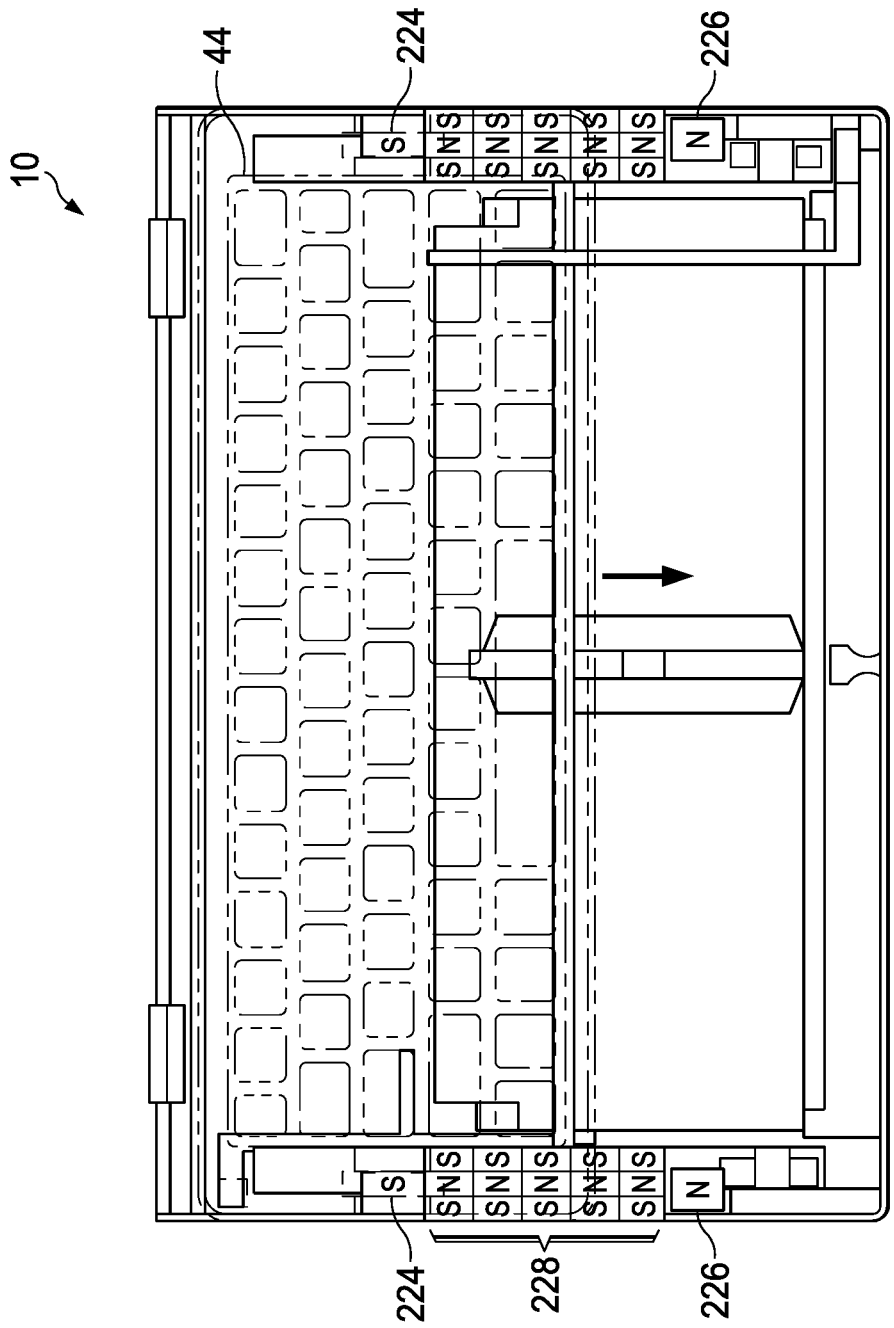
FIGS. 18A and 18B depict a top cutaway view of a keyboard biased between forward and rearward positions by magnetic guide rails.
Figure 18B:
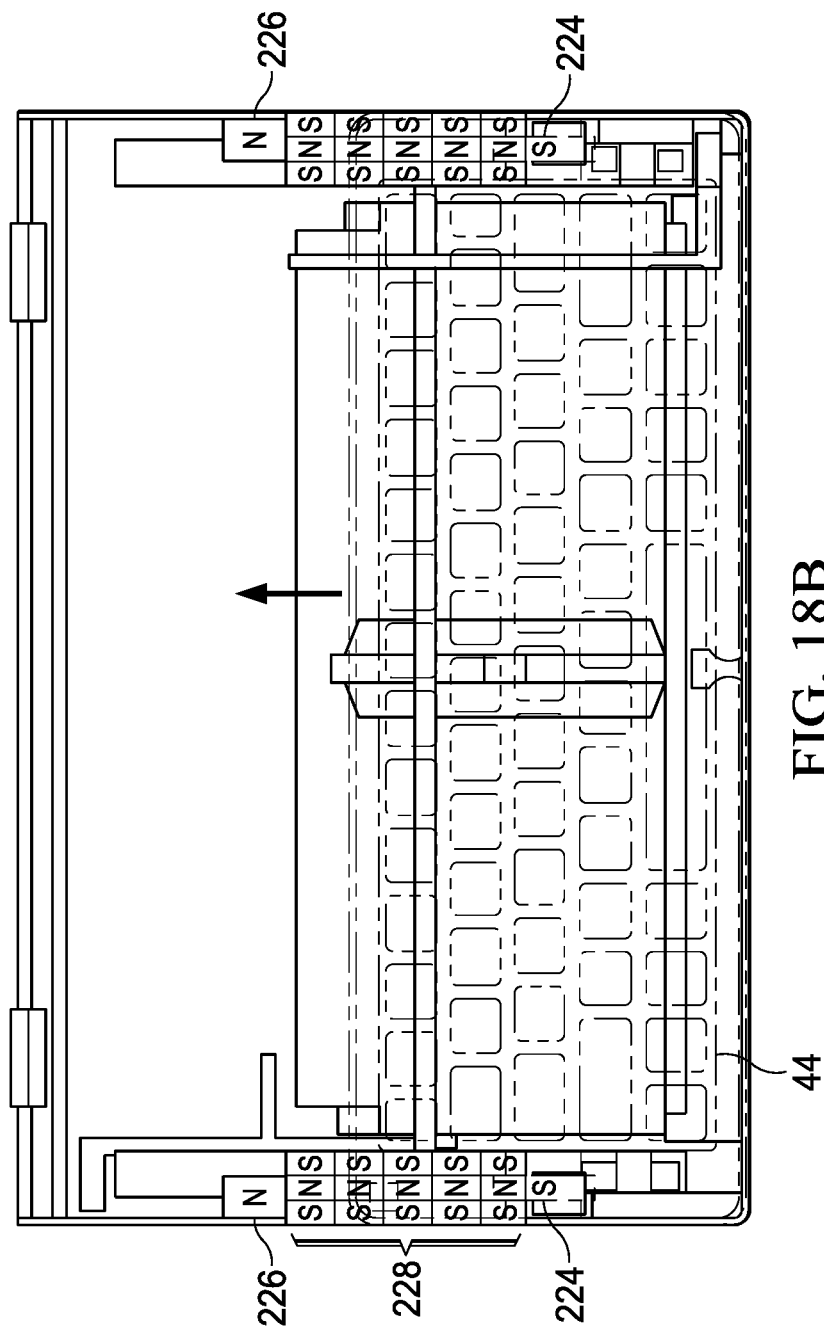

Referring now to FIGS. 18A and 18B, a top cutaway view depicts keyboard 44 biased between forward and rearward positions by magnetic guide rails 228. FIG. 18A depicts keyboard 44 in the rearward position with anchor magnets 224 aligned over the detent magnets 226 positioned closest to hinge 14. FIG. 18B depicts keyboard 44 in the forward position with anchor magnets 224 aligned over detent magnets 226 positioned distal hinge 14. Between detent magnets 226 on each side of display 28, the central row of magnets have a polarity opposite the anchor magnets 224 and outside row polarity that matches anchor magnet so that keyboard 44 is guided along a path defined by the central row of magnets. As a result, an end user experiences a smooth transition of keyboard 44 between the forward and rearward positions. In one alternative embodiment, more than two magnetic guide rails may be included under display 28 and may align with more than two anchor magnets in keyboard 28. Further, positions in addition to the forward and rearward positions may be supported. For instance, at a system with a larger viewing area, left and right positions may be supported as may a midway position between the forward and rear positions.

Although the present invention has been described in detail, it should be understood that various changes, substitutions and alterations can be made hereto without departing from the spirit and scope of the invention as defined by the appended claims.

What is claimed is:

1. An information handling system comprising:
   a housing having first and second housing portions rotationally coupled by a hinge;
   a processor disposed in the housing and operable to executed instructions that process information;
   a memory disposed in the housing and interfaced with the processor;
   a display disposed over at least one of the first and second housing portions, the display operable to present the information as visual images and having a touch detection surface operable to detect touches;
   a touch controller interfaced with the touch detection surface and operable to distinguish touches at the touch detection surface based upon a periodic touch detection surface calibration performed by the touch controller;
   an embedded controller interfaced with the touch controller and operable to modify the touch controller periodic touch detection surface calibration based upon detection of a keyboard placed on the display;
   a magnet disposed in the keyboard; and
   a magnetic sensor disposed at the display to detect the magnet, the magnetic sensor interfaced with embedded controller, the embedded controller modifying the touch controller periodic touch detection surface calibration based upon detection of the magnet.

2. The information handling system of claim 1 wherein the embedded controller modifies the touch controller periodic touch detection surface calibration by suspending the periodic touch detection surface calibration for a portion of the touch detection surface associated with a location of the keyboard when the magnetic sensor detects the magnet.

3. The information handling system of claim 2 further comprising first and second magnetic sensors disposed at first and second locations of the display, the embedded controller suspending the periodic touch detection surface calibration for a first portion of the touch detection surface if the first magnetic sensor detects the magnet, the embedded controller suspending the periodic touch detection surface calibration for a second portion of the touch detection surface if the second magnetic sensor detects the magnet.

4. The information system of claim 3 wherein embedded controller confirms a location of the keyboard on the display by analysis of touch detection at the touch detection surface.

5. The information handling system of claim 1 wherein the embedded controller detects removal of the keyboard from the display by separation of the magnet from the magnetic sensor and, in response to the removal commands a touch detection surface calibration.

6. The information handling system of claim 1 wherein the touch controller stores a touch detection surface calibration value when the embedded controller modifies the periodic touch controller calibration and the touch controller applies the stored touch detection surface calibration when the embedded controller detects removal of the keyboard from the display by separation of the magnet from the magnetic sensor.

7. The information handling system of claim 1 further comprising:
   first and second displays, the first display disposed at the first housing portion, the second display disposed at the second housing portion;
   a first magnetic sensor disposed at the first display to detect the magnet; and
   a second magnetic sensor disposed at the second display to detect the magnet;
   wherein the first and second magnetic sensors interface with the embedded controller, the embedded controller modifying the touch controller periodic touch detection surface calibration based upon detection of the magnet.

8. The information handling system of claim 1 wherein the embedded controller modifies the touch controller periodic touch detection surface calibration by:
   suppressing the touch controller periodic touch detection surface calibration at a location of the keyboard; and
   applying a palm rest calibration algorithm outside the location of the keyboard.

9. A method for calibrating an information handling system touchscreen display, the method comprising:
   periodically calibrating the touchscreen display;
   detecting a keyboard placed upon a display touchscreen touch detection surface; and
   in response to the detecting a keyboard, modifying the periodically calibrating, wherein the periodically modifying further comprises:
   ceasing the periodically calibrating at a first portion of the touchscreen display associated with a location of the keyboard on the touchscreen display; and
   continuing the periodically calibrating at a second portion of the touchscreen display distal the location of the keyboard.

10. The method of claim 9 further comprising:
    detecting removal of the keyboard from the touchscreen touch detection surface; and
    in response to the detecting removal, commanding a calibration of the touchscreen touch detection surface.

11. The method of claim 10 further comprising:
    determining the keyboard location as proximate a hinge of the information handling system; and
    in response to the determining, applying periodic calibration at the second portion of the touchscreen display with a palm rejection logic.

12. The method of claim 9 wherein the detecting a keyboard placement further comprises:
    integrating a magnet in the keyboard; and
    sensing the magnet with a magnetic sensor disposed under the touchscreen display.

13. The method of claim 12 wherein the detecting further comprises:
    sensing with the touchscreen display an object at a location of the touchscreen display; and
    in response to the sensing with the touchscreen display, confirming the detecting a keyboard if the object has a touch profile matching a touch profile of the keyboard.

14. A method for calibrating an information handling system touchscreen display, the method comprising:
    periodically calibrating the touchscreen display;
    detecting a keyboard placed upon a display touchscreen touch detection surface;

in response to the detecting a keyboard, modifying the periodically calibrating;

storing calibration information of the touchscreen display;

detecting removal of the keyboard from the touchscreen display; and applying the stored calibration information at the touchscreen display.

15. A display comprising:

a touchscreen display operable to present visual images and to detect touches;

a touch controller interfaced with the touchscreen display and operable to analyze the detected touches to detect inputs, the touch controller operable to perform a periodical calibration of the touchscreen display to aid detection of inputs;

an embedded controller interfaced with the touch controller to accept touch inputs detected by the touch controller; and a keyboard detector interfaced with the embedded controller and operable to detect a keyboard placed on the touchscreen display;

wherein the embedded controller responds to detection of a keyboard by the keyboard detector with a command to the touch controller to modify the periodical calibration and the embedded controller commands the touch controller to modify the periodical calibration by ceasing periodical calibration in a portion of the touchscreen display on which the keyboard is placed.

16. The display of claim 15 wherein the keyboard detector comprises a Hall sensor disposed under the touchscreen display positioned to detect a magnet integrated in the keyboard.

17. The display of claim 15 wherein the keyboard detector is further operable to detect removal of the keyboard from the touchscreen display and the embedded controller responds to the detection of removal of the keyboard with a command to the touch controller to perform a calibration.

* * * * *